United States Patent
Kossoy et al.

(10) Patent No.: US 12,221,572 B2
(45) Date of Patent: Feb. 11, 2025

(54) LIGHT EMITTING CORE AND SHELL NANOPARTICLE

(71) Applicant: MERCK PATENT GMBH, Darmstadt (DE)

(72) Inventors: Elizaveta Kossoy, Rehovot (IL); Shany Neyshtadt, Jerusalem (IL); Sanaa Khalil, Jerusalem (IL); Alex Rabkin, Jerusalem (IL); Jessica Benjamini Ettedgui, Rockville, MD (US)

(73) Assignee: MERCK PATENT GMBH, Darmstadt (DE)

( * ) Notice: Subject to any disclaimer, the term of this patent is extended or adjusted under 35 U.S.C. 154(b) by 572 days.

(21) Appl. No.: 17/606,265

(22) PCT Filed: Apr. 23, 2020

(86) PCT No.: PCT/EP2020/061262
§ 371 (c)(1),
(2) Date: Oct. 25, 2021

(87) PCT Pub. No.: WO2020/216813
PCT Pub. Date: Oct. 29, 2020

(65) Prior Publication Data
US 2022/0298411 A1     Sep. 22, 2022

(30) Foreign Application Priority Data

Apr. 26, 2019 (EP) .................................. 19171350

(51) Int. Cl.
| C09K 11/02 | (2006.01) |
| B82Y 40/00 | (2011.01) |
| C09K 11/54 | (2006.01) |
| C09K 11/70 | (2006.01) |
| C09K 11/88 | (2006.01) |
| H10K 50/115 | (2023.01) |

(52) U.S. Cl.
CPC ............ *C09K 11/025* (2013.01); *B82Y 40/00* (2013.01); *C09K 11/54* (2013.01); *C09K 11/70* (2013.01); *C09K 11/883* (2013.01); *H10K 50/115* (2023.02)

(58) Field of Classification Search
CPC .... C09K 11/025; C09K 11/883; H10K 50/115
See application file for complete search history.

(56) References Cited

U.S. PATENT DOCUMENTS

| 2009/0110642 A1 | 4/2009 | Woo et al. |
| 2017/0250322 A1* | 8/2017 | Wang .................. C09K 11/883 |
| 2017/0306227 A1* | 10/2017 | Ippen ..................... C09K 11/70 |
| 2018/0119007 A1* | 5/2018 | Ippen .................. H10K 50/115 |
| 2019/0115212 A1* | 4/2019 | Nadal ............... H01L 21/02562 |
| 2020/0102494 A1 | 4/2020 | Mocatta et al. |

FOREIGN PATENT DOCUMENTS

| KR | 20180069687 A | 6/2018 |
| WO | 18215396 A1 | 11/2018 |

OTHER PUBLICATIONS

Turo el al., "Dual mode crystal bound and X type passivation of quantum dots", Chem. Commun , 2016, vol. 52, issue 82, pp. 12214-12217, Sep. 16, 2016.*
Jun et al, "Bright and Stable Alloy Core/ Multishell Quantum Dots", Angew Chem. Int. Ed., vol. 52, Issue 2, pp. 679-682, Dec. 28, 2012.*
Turo et al., "Crystal Bound vs Surface Bound Thiols on Nanocrystals" ACS NANO, 2014, 8 (10), 10205-10213.
Turo et al., "Dual mode crystal bound and X type passivation of quantum dots"; Chem. Commun., 2016, 52, 12214-12217.
Robinson et al.,"Controlled Surface Chemistry for the Directed Attachment of Copper(I) Sulfide Nanocrystals" Chem. Mater. 2017, 29, 3854-3857.
Zhou et al., "Surface ligands engineering of semiconductor quantum dots for chemosensory and biological applications" Materials Today; 2017, 20 (7), 360-376.
International Search Report PCT/EP2020/061262 dated Jul. 21, 2020 (pp. 1-2).
Notification of Reasons for Refusal (1st Office Action) in corresponding JP Appln. No. 2021-563205 dated Mar. 27, 2024 (pp. 1-2).

* cited by examiner

*Primary Examiner* — C Melissa Koslow
(74) *Attorney, Agent, or Firm* — MILLEN, WHITE, ZELANO & BRANIGAN, P.C.; Brion P. Heaney

(57) ABSTRACT

A semiconducting light emitting nanoparticle is described having a core and shell structure. The particle has a core and an outer layer or shell. The outer layer covers at least part of the core and contains a metal cation and a divalent anion. Additionally, one or more organic moieties are directly attached to the anion of the outer layer by covalent bond. The divalent anion is $Se^{2-}$, $S^{2-}$, $Te^{2-}$, $O^{2-}$ or a combination thereof. The metal cation can be a monovalent, cation, trivalent, or tetravalent cation. Also, a process for synthesizing the semiconducting light emitting nanoparticle is described.

23 Claims, 3 Drawing Sheets

LIGHT EMITTING CORE AND SHELL NANOPARTICLE

FIELD OF THE INVENTION

The present invention relates to a nanoparticle; a process for preparing a nanoparticle; composition, formulation and use of a nanoparticle, an optical medium; and an optical device.

BACKGROUND ART

Light emitting nanoparticles are known in the prior art documents.

For example, Turo et al., ACS NANO vol. 8, no. 10, 10205-10203, 2014 discloses $Cu_2S$ Nanoparticles having no shell layers with dodecanethiol (DDT) and the fabrication process with using DDT at the temperature of 200° C. DDT was used in the entire synthesis process.

Turo et al., Chem Commun, 2016, 52, 12214-12217 describes CdSe/ZnS with dodecanethiol.

Robinson et al., Chem Mater, 2017, 29, 3854-3857 mentions quasi spherical $Cu_2S$ nanorods with DDT.

PATENT LITERATURE

No literature

NON-PATENT LITERATURE

1. Turo et al., ACS NANO vol. 8, no. 10, 10205-10203, 2014
2. Chem Commun, 2016, 52, 12214-12217
3. Robinson et al., Chem Mater, 2017, 29, 3854-3857

SUMMARY OF THE INVENTION

However, the inventors newly have found that there is still one or more of considerable problems for which improvement is desired, as listed below; improvement of particle size distribution, better Full Width at Half Maximum (FWHM) value, improved self-absorption value, improvement of absorption per mg of nanoparticle(s), improvement of quantum yield of nanoparticle, well-controlled shell thickness, improved charge injection ability of nanoparticle, higher device efficiency, lowering trap emission of nanoparticle, optimizing a surface condition of shell part of nanoparticle, reducing lattice defects of a shell layer of nanoparticle, reducing/preventing formation of dangling bonds of shell layer, better thermal stability, better chemical stability, improved chemical stability in desired solvent(s), improved thermal stability in desired solvent(s), improved chemical stability in desired matrix(es), improved thermal stability in desired matrix(es), improved dispersion in matrixes, improved dispersion in solvents, improved hole injection ability into semiconducting light emitting nanoparticle, improved external quantum efficiency, optimizing fabrication process of nanoparticle, providing new fabrication process to improve size control of nanoparticle, providing new fabrication process for better kinetics control in shell formation, new shell formation process to realize well controlled shell thickness and/or reducing lattice defects of a shell layer, environmentally more friendly and safer fabrication process.

The inventors aimed to solve one or more of the above-mentioned problems.

Then it was found a novel semiconducting nanoparticle, preferably it is a semiconducting light emitting nanoparticle, comprising, essentially consisting of, or consisting of, a core;
an outer layer covering at least a part of said core, comprising a metal cation and a divalent anion; and
one or more types of organic moieties directly attached to the anion of the outer layer by covalent bond,
wherein said divalent anion is selected from $Se^{2-}$, $S^{2-}$, $Te^{2-}$ $O^{2-}$ or a combination of any of these, preferably said metal cation is a monovalent, divalent cation, trivalent or tetravalent cation, more preferably said metal cation is a divalent cation selected from the group consisting of $Zn^{2+}$, $Ni^{2+}$, $Co^{2+}$, $Ca^{2+}$, $Sr^{2+}$, $Hg^{2+}$, $Mg^{2+}$ and $Pb^{2+}$, or a tetravalent cation selected from the group consisting of $Ti^{4+}$, $Ge^{4+}$, $Si^{4+}$, $Zr^{4+}$, $Hf^{4+}$, and $Sn^{4+}$.

In some embodiments of the present invention, said outer layer comprises at least two or three different metal cations such as the combination of $Cu^{1+}$ and $In^{3+}$, $Cu^{1+}$ and $Ga^{3+}$, $Ag^{1+}$ and $Ga^{3+}$ or a combination of $Cu^{+1}/In^{+3}/Zn^{+2}$.

In another aspect, the present invention further relates to a process for fabricating a light emitting nanoparticle comprising at least following steps,
(a) mixing at least a semiconducting nanoparticle, preferably said semiconducting nanoparticle comprises at least a $1^{st}$ semiconducting nanomaterial as a core, with another material to get a reaction mixture, preferably said another material is a solvent;
(b) forming an outer layer onto the semiconducting nanoparticle in the reaction mixture by reacting at least an anion source represented by chemical formula (Va) or chemical formula (Vb) with a metal cation precursor in a reaction mixture, in some embodiment of the present invention, said metal cation precursor can be the same to the cation shell precursor;

$$A\text{-}B\text{-}X\text{-}H \tag{Va}$$

$$A\text{-}B\text{-}X\text{-}X\text{-}B\text{-}A \tag{Vb}$$

wherein
A is an organic group;
B is a connecting unit connecting A and X;
H is a hydrogen atom; and
X is an anchor group comprising an anion, capable to form a monolayer with the added metal cation derivable from the added metal cation precursor;
(c) cooling the reaction mixture from step (b),
wherein the reaction mixture in step (b) is kept at a temperature in the range from 80° C. to 200° C., preferably 100 to 200° C. to form the outer layer in step (b).

In another aspect, the present invention relates to a semiconducting nanoparticle or a semiconducting light emitting nanoparticle obtainable or obtained from the process of the present invention.

In another aspect, the present invention also relates to composition comprising, essentially consisting of, or consisting of, at least one semiconducting nanoparticle of the present invention,
and at least one additional material, preferably the additional material is selected from the group consisting of organic light emitting materials, inorganic light emitting materials, charge transporting materials, scattering particles, host materials, nanosized plasmonic particles, photo initiators, and matrix materials.

In another aspect, the present invention relates to formulation comprising, essentially consisting of, or consisting of, at least one semiconducting nanoparticle of the present invention, or a composition of the present invention, and at least one solvent, preferably the solvent is selected from one or more members of the group consisting of aromatic, halogenated and aliphatic hydrocarbon solvents, ethers, esters, ionic liquids, alcohols and water, more preferably selected from one or more members of the group consisting of toluene, xylene, tetrahydrofuran, chloroform, dichloromethane and heptane, hexane, purified water, ester acetates, ether acetates, ketones, etheric esters such as PGMEA, alcohols such as ethanol, isopropanol etc., sulfoxides, formamides, nitrides, ketones.

In another aspect, the present invention relates to use of the semiconducting nanoparticle, the composition, or the formulation, in an electronic device, optical device, sensing device or a biomedical device.

In another aspect, the present invention further relates to an optical medium comprising at least one light emitting nanoparticle of the present invention, or the composition.

In another aspect, the present invention further relates to an optical device comprising at least said optical medium.

DETAILED DESCRIPTION OF THE INVENTION

Semiconducting Nanoparticle

Figure 1:
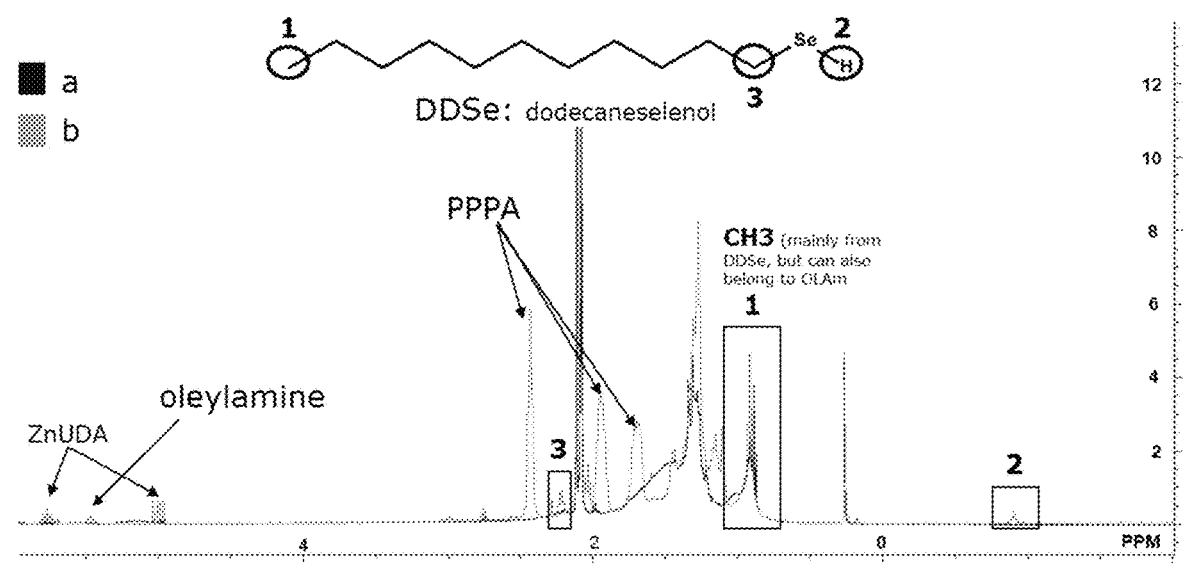
FIG. 1: $^1$H NMR spectra (in toluene d8) of QDs from working example 1 before (a) and after (b) addition of 3-phenylpropylphosphonic (PPPA).

According to the present invention, in one aspect, said semiconducting nanoparticle, preferably it is a semiconducting light emitting nanoparticle, comprising, essentially consisting of, or consisting of, a core;
an outer layer covering at least a part of said core, comprising a metal cation and a divalent anion; and
an organic moiety, preferably one or more types of organic moieties directly attached to the anion of the outer layer by covalent bond,
wherein said divalent anion is selected from $Se^{2-}$, $S^{2-}$, $Te^{2-}$ $O^{2-}$ or a combination of any of these, preferably said metal cation is a monovalent, divalent cation, trivalent or tetravalent cation, more preferably said metal cation is a divalent cation selected from the group consisting of $Zn^{2+}$, $Ni^{2+}$, $Co^{2+}$, $Ca^{2+}$, $Sr^{2+}$, $Hg^{2+}$, $Mg^{2+}$ and $Pb^{2+}$, or a tetravalent cation selected from the group consisting of $Ti^{4+}$, $Ge^{4+}$, $Si^{4+}$, $Zr^{4+}$, $Hf^{4+}$, and $Sn^{4+}$, The nanoparticle comprises at least an outer layer and a core. Said nanoparticle may optionally contain one or more of other layers (shell layers) between the outer layer and the core.

The outer layer covers at least a part of said core. The outer layer may have a direct physical contact with said core if there is no other layers between the outer layer and the core.

The outer layer may cover the core via one or more of additional layers placed between the outer layer and the core.

The term "cover" and the term "covering" do not necessarily mean that there is always a physical contact between the said core and the outer layer.

In some embodiments of the present invention, said outer layer comprises at least two or three different metal cations such as the combination of $Cu^{1+}$ and $In^{3+}$, $Cu^{1+}$ and $Ga^{3+}$, $Ag^{1+}$ and $Ga^{3+}$ or a combination of $Cu^{+1}/In^{+3}/Zn^{+2}$.

According to the present invention, the term "nanosized" means the size in between 0.1 nm and 999 nm, preferably 0.5 nm to 150 nm, more preferably 1 nm to 50 nm.

According to the present invention, the term "semiconductor" means a material having electrical conductivity to a degree between that of a conductor (such as copper) and that of an insulator (such as glass) at room temperature, preferably, a semiconductor is a material whose electrical conductivity increases with the temperature.

Therefore, according to the present invention, the term "semiconductor nanoparticle" is taken to mean that a material having electrical conductivity to a degree between that of a conductor (such as copper) and that of an insulator (such as glass) at room temperature, preferably, a semiconductor is a material whose electrical conductivity increases with the temperature and the size is in between 0.1 nm and 999 nm, preferably 0.5 nm to 150 nm, more preferably 1 nm to 50 nm.

According to the present invention, the term "size" means the average diameter of the circle with the area equivalent to the measured TEM projection of the semiconducting nanosized light emitting particles.

In a preferred embodiment of the present invention, the semiconducting light emitting nanoparticle of the present invention is a quantum sized material.

According to the present invention, the term "quantum sized" means the size of the first semiconducting nanoparticle itself without ligands or another surface modification, which can show the quantum confinement effect, like described in, for example, ISBN:978-3-662-44822-9.

Generally, it is said that the quantum sized materials can emit tunable, sharp and vivid colored light due to "quantum confinement" effect.

In some embodiments of the invention, the size of the overall structures of the quantum sized material, is from 1 nm to 50 nm.

In a preferred embodiment of the present invention, the average diameter of the first semiconducting nanoparticle (core) is in the range from 1 to 20 nm, preferably it is in the range from 1.5 to 12 nm.

The average diameter of the semiconducting light emitting nanoparticles (cores) are calculated based on 100 semiconducting light emitting nanoparticles in a TEM image taken by a Tecnai G2 Spirit Twin T-12 Transmission Electron Microscope. The average diameter of the semiconducting light emitting nanoparticles are calculated using Fiji_ImageJ program.

Organic Moiety

In a preferred embodiment of the present invention, the organic moiety is represented by following chemical formula (I);

$$A\text{-}B\text{-}* \tag{I}$$

wherein
A is an organic group; and
B is a connecting unit;
"*" represents the connecting point to the anion in the outer layer.

More preferably, the organic moiety is represented by following chemical formula (II), (III) or (IIIa);

$$L\text{-}(U)_o\text{-}(Y)_m\text{-}(CH_2)_n\text{-}* \tag{II}$$

wherein
L is an organic group, preferably said organic group is hydrocarbyl (alkyl, aryl, aralkyl and alkylaryl), heteroaromatic group, including aryl, alkaryl, alkyl or aralkyl, alkylamine, fluoroaryl, fluoroalkaryl, fluoroalkyl, fluoroaralkyl, heteroaromatic group, including fluoroaryl, fluoroalkaryl, fluoroalkyl or fluoroaralkyl;
U is O, $CH_2$ or C=O;
Y is O, $CH_2$ or C=O;
n is an integer 1 or more;
m is 0 or an integer 1 or more, preferably m is 1;
o is 0 or an integer 1 or more, preferably o is 1;
"*" represents the connecting point to the anion in the outer layer, preferably said anion is selected from one or more members of the group consisting of $Se^{2-}$, $S^{2-}$, $Te^{2-}$ $O^{2-}$, more preferably the organic moiety is covalently bound to Se, S, Te or O atom in the outer layer;

$$*\text{-}(CH_2)_a\text{-}(OCH_2CH_2)_p\text{-}(V)_r\text{-}(CH_2)_q\text{-}Z \tag{III}$$

$$*\text{-}(CH_2)_q\text{-}(V)_r\text{-}(OCH_2CH_2)_p\text{-}Z \tag{IIIa}$$

wherein
V is O, $CH_2$ or C=O;
Z is a hydrogen atom or an organic group, preferably Z is a hydrogen atom; a linear unsaturated hydrocarbyl group having 2 to 30 carbon atoms, a branched unsaturated hydrocarbyl group having 3 to 30 carbon atoms, or aromatic hydrocarbyl group, such as a straight alkyl group having 1 to 25 carbon atoms, a branched alkyl group having 3 to 25 carbon atoms; —COOH, —SH, or —$NH_2$, alkylamine, fluoroaryl, fluoroalkaryl, fluoroalkyl, fluoroaralkyl, heteroaromatic group, including fluoroaryl, fluoroalkaryl, fluoroalkyl or fluoroaralkyl, preferably Z is a hydrogen atom, a straight alkyl group having 1 to 25 carbon atoms, a branched alkyl group having 3 to 25 carbon atoms, more preferably it is a hydrogen atom, a straight alkyl group having 1-15 carbon atoms, a branched alkyl group having 3-15 carbon atoms, even more preferably it is a hydrogen atom, or a straight alkyl group having 1-10 carbon atoms;
a is 0 or an integer 1 or more, preferably $0 \leq a \leq 25$, more preferably $0 \leq a \leq 15$, even more preferably $1 \leq a \leq 10$;
p is 0 or an integer 1 or more, preferably $0 \leq p \leq 45$, more preferably $0 \leq p \leq 25$, even more preferably $1 \leq p \leq 20$, furthermore preferably $4 \leq p \leq 16$;
q is 0 or an integer 1 or more, preferably $0 \leq q \leq 25$, more preferably $0 \leq q \leq 15$, even more preferably $0 \leq q \leq 10$, furthermore preferably it is $1 \leq q \leq 5$;
r is 0 or an integer 1;
"*" represents the connecting point to the anion in the outer layer, preferably said anion is selected from one or more members of the group consisting of $Se^{2-}$, $S^{2-}$, $Te^{2-}$ $O^{2-}$, more preferably the organic moiety is covalently bound to Se, S, Te or O atom in the outer layer.

Even more preferably, the organic moiety of the present invention is represented by following chemical formula (IV):

$$*\text{-}(CH_2)_a\text{-}(OCH_2CH_2)_p\text{-}(O)_r\text{-}(CH_2)_q\text{-}Z' \tag{IV}$$

wherein a is 0 or an integer 1 or more, preferably $0 \leq a \leq 25$, more preferably $0 \leq a \leq 15$, even more preferably $1 \leq a \leq 10$;
p is 0 or an integer 1 or more, preferably $0 \leq p \leq 45$, more preferably $0 \leq p \leq 25$, even more preferably $1 \leq p \leq 20$, furthermore preferably $4 \leq p \leq 16$;
q is 0 or an integer 1 or more, preferably $0 \leq q \leq 25$, more preferably $0 \leq q \leq 15$, even more preferably $0 \leq q \leq 10$, furthermore preferably it is 1;
Z' is a hydrogen atom, a straight alkyl group having 1 to 25 carbon atoms, a branched alkyl group having 3 to 25 carbon atoms, alkylamine, fluoroaryl, fluoroalkaryl, fluoroalkyl, fluoroaralkyl, heteroaromatic group, including fluoroaryl, fluoroalkaryl, fluoroalkyl or fluoroaralkyl, preferably Z' is a straight alkyl group having 1 to 25 carbon atoms, a branched alkyl group having 3 to 25 carbon atoms or a hydrogen atom, more preferably it is a straight alkyl group having 1-15 carbon atoms, a branched alkyl group having 3-15 carbon atoms or a hydrogen atom, even more preferably it is a hydrogen atom;
r is 0 or an integer 1;
"*" represents the connecting point to the anion in the outer layer, preferably it is the connecting point to S atom or Se atom in the outer layer.

More preferably the organic moiety is *—$(CH_2)_2$—$(OCH_2CH_2)_{5 \leq p \leq 20}$—O—$CH_3$, more preferably it is *—$(CH_2)_2$—$(OCH_2CH_2)_6$—O—$CH_3$ and/or *—$(CH_2)_2$—$(OCH_2CH_2)_{16}$—O—$CH_3$ connecting to S atom or Se atom in the outer layer.

In some of the preferred embodiments the organic moiety is $CH_3$—$(CH_2)_{7<n<18}$—* and connecting to the S or Se atom in the outer layer.

In a preferred embodiment of the present invention, the organic moiety selected from chemical formula (I), (II), (III), (III') or (IV) is covalently bound to the anion in an inorganic lattice of the outer layer, preferably it is not removed by a ligand exchange.

Crystal bound ligands (covalently bound ligands) can be characterized as described in working example 7.

For examples, the organic moiety can be described as follows preferably.

*—$CH_2$—$(OCH_2CH_2)_4$—O—$CH_3$
*—$CH_2$—$(OCH_2CH_2)_6$—O—$CH_3$
*—$CH_2$—$(OCH_2CH_2)_8$—O—$CH_3$
*—$(CH_2)_2$—$(OCH_2CH_2)_2$—O—$CH_3$
*—$(CH_2)_2$—$(OCH_2CH_2)_6$—O—$CH_3$
*—$(CH_2)_2$—$(OCH_2CH_2)_8$—O—$CH_3$
*—$(CH_2)_2$—$(OCH_2CH_2)_6$—$CH_3$
*—$(CH_2)_2$—$(OCH_2CH_2)_6$—O—$(CH_2)_2$—SH
*—$(CH_2)_7$—$CH_3$
*—$(CH_2)_{11}$—$CH_3$
*—$(CH_2)_{17}$—$CH_3$
*—$(CH_2)_2$—$(OCH_2CH_2)_6$—O—$CH_3$
*—$(CH_2)_2$—$(OCH_2CH_2)_{16}$—O—$CH_3$
*—$(CH_2)_2$—$(OCH_2CH_2)_{17}$—O—$CH_3$
"*" represents the connecting point to S atom or Se atom in the outer layer; or
*—$(CH_2)_{11}$—$CH_3$ "*" represents the connecting point to Se atom or S atom in the outer layer.

In some embodiments, said organic moiety of chemical formula (I), (II) can be an organic moiety represented by following chemical formula Ia, Ib, Ic, Id, Ie, IIa, IIb, IIc, IId, IIe, IIf, IIg, IIh, IIi or IIj;

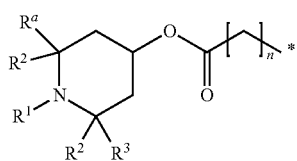

Ia

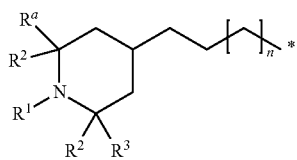

Ib

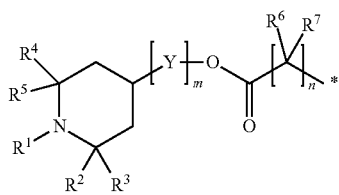

Ic

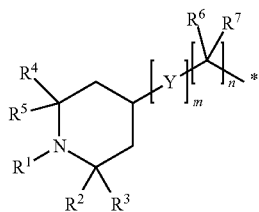

Id wherein Y is a bonding unit having two bounding parts, m is 0 or 1, $R^6$ is a hydrogen atom or $R^1$, $R^7$ is a hydrogen atom or $R^1$.

$R^1$, and $R^5$ are at each occurrence, independently or dependently of each other, an alkyl group having 1 to 18 carbon atoms, cycloalkyl having 5 to 12 carbon atoms, alkenyl having 2 to 18 carbon atoms, cycloalkenyl having 5 to 12 carbon atoms, aralkyl having 7 to 15 carbon atoms, a radical of a saturated or unsaturated bicyclic or tricyclic hydrocarbon having 7 to 12 carbon atoms or aryl having 6 to 10 carbon atoms or said aryl substituted by alkyl, or $OR^x$;

$R^x$ is an alkyl group having 1 to 18 carbon atoms, cycloalkyl having 5 to 12 carbon atoms, alkenyl having 2 to 18 carbon atoms, cycloalkenyl having 5 to 12 carbon atoms, aralkyl having 7 to 15 carbon atoms, a radical of a saturated or unsaturated bicyclic or tricyclic hydrocarbon having 7 to 12 carbon atoms or aryl having 6 to 10 carbon atoms or said aryl substituted by alkyl;

$R^2$ is a hydrogen atom or $R^3$;

$R^a$ is an alkyl group having 1 to 36 carbon atoms, preferably selected from methyl, ethyl, propyl, butyl, entyl, hexyl, octyl, decyl, tetradecyl, hexadecyl, eicosyl, docosyl, pentacosyl, heptacosyl, triacontyl, dotriacontyl, tetratriacontyl, hexatriacontyl and branched isomers thereof;

$R^3$ is a cycloalkyl group having 5 to 12 carbon atoms, phenyl or naphthyl, which is unsubstituted or substituted by alkyl of 1 to 36 carbon atoms or aralkyl having 7 to 9 carbon atoms which is unsubstituted or substituted by alkyl having 1 to 36 carbon atoms.

$R^4$ is an alkyl group having 1 to 36 carbon atoms, preferably selected from methyl, ethyl, propyl, butyl, entyl, hexyl, octyl, decyl, tetradecyl, hexadecyl, eicosyl, docosyl, pentacosyl, heptacosyl, triacontyl, dotriacontyl, tetratriacontyl, hexatriacontyl and branched isomers thereof;

$R^6$ is a hydrogen atom or $R^1$;

$R^7$ is a hydrogen atom or $R^1$;

"*" represents the connecting point to the anion in the outer layer, preferably said anion is selected from one or more members of the group consisting of $Se^{2-}$, $S^{2-}$, $O^{2-}$ and $Te^{2-}$, more preferably the organic moiety is bound to Se, S, O or Te atom in the outer layer;

n is zero or an integer;

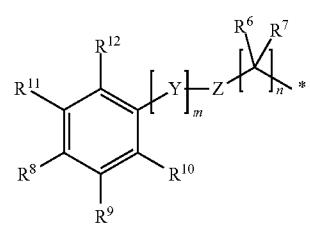

Ie wherein

Z is a bonding unit having two bounding parts, preferably it is selected from a substituted or unsubstituted straight alkyelene group having 1 to 10 carbon atoms, a substituted or unsubstituted alkoxylene group having 1 to 10 carbon atoms, Y is a connecting unit;

m is 0 or 1;

$R^6$ is a hydrogen atom or $R^1$;

$R^7$ is a hydrogen atom or $R^1$;

$R^8$ is OH, a hydrogen atom or $R^1$;

$R^9$ is OH, a hydrogen atom or $R^1$;

$R^{10}$ is a hydrogen atom or $R^1$;

$R^{11}$ is OH, a hydrogen atom or $R^1$;

$R^{12}$ is a hydrogen atom or $R^1$;

In some embodiments, the organic moiety represented by chemical formula II) is an organic moiety represented by IIa, IIb, IIc, IId, IIe IIf, IIg, IIh, IIi or IIj;

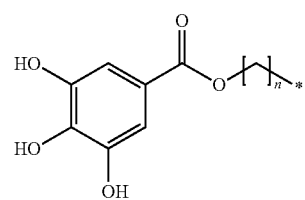

IIa

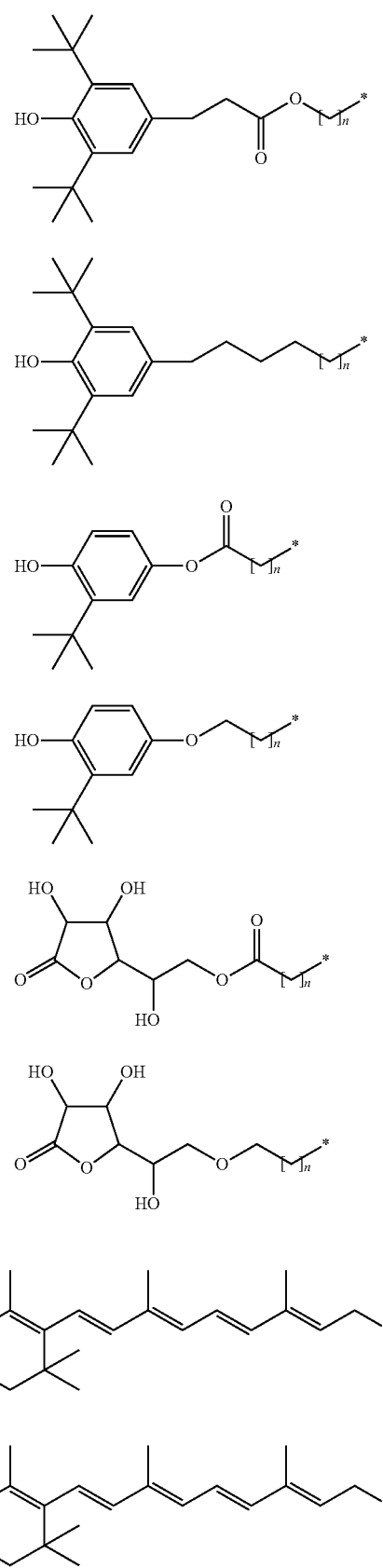

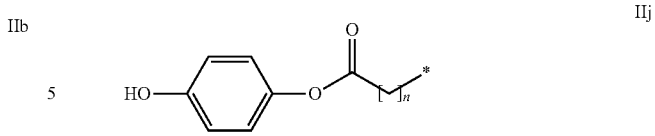

"*" represents the connecting point to the anion in the outer layer, preferably the organic moiety of formula IIa, IIb, IIc, IId, IIe IIf, IIg, IIh, IIi or IIj is bound to Se, S or Te or O atom in the outer layer;

n is zero or an integer.

In some embodiments the organic moiety has a biological function.

In some embodiments the ligand is bifunctional allowing the nanoparticle to bind to a specific site.

It is believed that the organic moiety prevents aggregation of nanoparticles or nanosized material, the organic moiety allows to disperse the nanoparticles in the organic medium and/or in aqueous medium.

It is also believed that the organic moiety allows to increase cellular uptake.

In some embodiments the organic moiety resembles the structures like described in:

1. Chemistry & Biology 18, Jan. 28, 2011, 10-24,
2. J. Am. Chem. Soc., 2007, 129 (45), pp 13987-13996,
3. Materials Today, Volume 20, Issue 7, 2017, Pages 360-376

In some embodiments the organic moiety comprises a protein or protein building block.

In some embodiments the organic moiety comprises a zwitterionic group.

Core

According to the present invention, the semiconducting nanoparticle comprises a core, the core can be made from several kinds of semiconducting material, for example, CdS, CdSe, CdTe, ZnS, ZnSe, ZnSeS, ZnTe, ZnO, GaAs, GaP, GaSb, CuS, $Cu_2S$, CuSe, $Cu_2Se$, FeS, FeSe, FeO, FeTe, HgS, HgSe, HgSe, HgTe, InAs, InxGa1-xAs, InP, InP:Zn, InP:ZnS, InP:ZnSe, InP:ZnSSe, InP:Ga,or InP:Ga, InSb InPS, InPZnS, InPSe, InPZn, InPZnSe, InPZnSeS, InPGa, InPGaZn, InP/ZnSe, In/ZnS, InZnP/ZnSe, InP/ZnSeTe, InZnP/ZnSeTe, InGaP/ZnSe, InP/InGaP, InZnP/InGaP, InCdP, InPCdS, InP/ZnSeS, InZnP/ZnSeS, InZnP/ZnS, InZnP/InGaP/ZnSe, InZnP/InGaP/ZnS, InZnP/InGaP/ZnSeS, InPCdSe, InGaP, InGaPZn, PbSe, PbS, InSb, AlAs, AlP, AlSb, $CuInS_2$, $CuInSe_2$, CuInZnSe, CuInZnS, $AgInS_2$, $TiO_2$ and a combination of any of these.

In some embodiments of the present invention, the core comprises at least a first element of group 12 or group 13 elements of the periodic table and a second element of group 15 or 16 elements of the periodic table, preferably said first element is an element of group 13 elements of the periodic table and said second element is an element of group 15 elements of the periodic table, more preferably the first element is a combination of In and Ga and the second element is P.

In a preferred embodiment of the present invention, the first core can further comprise additional element selected from one or more member of the group consisting of Ga, Zn, S, and Se.

In some embodiments the core is a metal oxide comprising for example ZnO, FeO, $Fe_2O_3$, $ZrO_2$, CuO, SnO $Cu_2O$, $TiO_2$, $WO_3$, $HfO_2$, $In_2O_3$, MgO, $A_2O_3$ and any combination of these.

In some embodiments the core comprises a metal, for example Au, Ag, W, Pd, Pt, Cu, In, Ti, Zn, Pb, Al, Cd, Zn and a combination of any of these.

In a preferred embodiment of the present invention, said first semiconducting nanomaterial is selected from the group consisting of InP, InP:Zn, InP:ZnS, InP:ZnSe, InP:ZnSSe, InP:Ga,or InP:GaZn, InP/ZnSe, InP/ZnS, InP/ZnSeS, InZnP/ZnSe, InZnP/ZnSeS, InZnP/ZnS, InGaP/ZnSe, InP/InGaP, InZnP/InGaP, InZnP/InGaP/ZnSe, InZnP/InGaP/ZnS, InZnP/InGaP/ZnSeS.

According to the present invention, a type of shape of the first semiconducting nanomaterial of the semiconducting nanoparticle, and shape of the semiconducting light emitting nanoparticle to be synthesized are not particularly limited.

For examples, spherical shaped, elongated shaped, star shaped, polyhedron shaped, pyramidal shaped, multipod shaped such as tetrapod shaped, tetrahedron shaped, platelet shaped, cone shaped, and irregular shaped first semiconducting nanosized material and—or a semiconducting light emitting material can be used.

In some embodiments of the present invention, the average diameter of the core is in the range from 1 to 20 nm, preferably from 1 to 12 nm, more preferably from 1.5 nm to 7 nm.

Outer Layer

According to the present invention, the semiconducting nanoparticle comprises an outer layer covering at least a part of said core, comprising at least one metal cation and at least one divalent anion, wherein said divalent anion is selected from $Se^{2-}$, $S^{2-}$, $Te^{2-}$ $O^{2-}$ or a combination of any of these, preferably said metal cation is a monovalent, divalent cation, trivalent or tetravalent cation, more preferably said metal cation is a divalent cation selected from the group consisting of $Zn^{2+}$, $Ni^{2+}$, $Co^{2+}$, $Ca^{2+}$, $Sr^{2+}$, $Fe^{2+}$, $Hg^{2+}$, $Mg^{2+}$ and $Pb^{2+}$, or a tetravalent cation selected from the group consisting of $Ti^{4+}$, $Ge^{4+}$, $Si^{4+}$, $Zr^{4+}$, $Hf^{4+}$, and $Sn^{4+}$, In some embodiments cation is monovalent cation selected from the group consisting of $Cs^+$, $Ag^+$, $Au^+$, $Cu^{+1}$ or a divalent cation selected from the group consisting of $Zn^{2+}$, $Fe^{+2}$, $Ni^{2+}$, $Co^{2+}$, $Ca^{2+}$, $Sr^{2+}$, $Hg^{2+}$, $Mg^{2+}$ and $Pb^{2+}$, $Cu^{+2}$ or a trivalent cation selected from the group $Fe^{+3}$, $In^{+3}$, $Bi^{+3}$, $Ga^{+3}$ a tetravalent cation selected from the group consisting of $Ti^{4+}$, $Ge^{4+}$, $Si^{4+}$, $Zr^{4+}$, $Hf^{4+}$, and $Sn^{4+}$, $Si^{+4}$.

In some embodiments of the present invention, said outer layer comprises at least two or three different metal cations such as the combination of $Cu^{1+}$ and $In^{3+}$, $Cu^{1+}$ and $Ga^{3+}$, $Ag^{1+}$ and $Ga^{3+}$ or a combination of $Cu^{+1}/In^{+3}/Z^{+2}$ or a combination of $Cu^{+1}/Ga^{+3}/Zn^{+2}$ or a combination of $Cu^+/In^{+3}/Ga^{+3}/Zn^{+2}$ or a combination of $Cu^{+1}/In^{+3}/Ga^{+3}$.

In a preferred embodiment, the metal cation is a divalent cation selected from the group consisting of $Fe^{+2}$ $Zn^{2+}$, $Ni^{2+}$, $Co^{2+}$, $Ca^{2+}$, $Sr^{2+}$, $Hg^{2+}$, $Mg^{2+}$ and $Pb^{2+}$, $Cu^{+2}$.

In a preferred embodiment of the present invention, said outer layer comprising, essentially consisting of, or consisting of a material represented by following chemical formula (VI), $$QP_{1-2h}A_h \quad (VI)$$

wherein Q is a divalent anion selected from one or more members of the group consisting of $Se^{2-}$, $S^{2-}$, $Te^{2-}$ $O^{2-}$;

P is a divalent metal cation, preferably P is a divalent cation selected from one or more member of the group consisting of $Zn^{2+}$, $Ni^{2+}$, $Co^{2+}$, $Ca^{2+}$, $Sr^{2+}$, $Hg^{2+}$, $Mg^{2+}$ and $Pb^{2+}$;

A is a tetravalent cation, preferably A is selected from one or more members of the group consisting of $Ti^{4+}$, $Ge^{4+}$, $Si^{4+}$, and $Sn^{4+}$; and $0 \leq h \leq 0.5$.

For examples, ZnS, ZnSe, ZnSeS, ZnTe, ZnO, ZnNiS, ZnNiSe, ZnGeS, ZnGeO, ZnCaS, NiSe, TiGeSeS, ZnTiS, CuInZnS, CuInZnSe, AgInZnS, and/or AgInZnSe can be used.

According to the present invention, preferably said outer layer is a monolayer.

More preferably, it is a last monolayer of the semiconducting nanoparticle covering the core. In case there is one or more of shell layers covering the core, then the outer layer is covering the shell layers.

Shell Layer

According to the present invention, in some embodiments, the core can be at least partially embedded in the first shell layer, preferably said core is fully embedded into one or more shell layers. In a preferred embodiment of the present invention, said shell layer(s) are placed in between the core and the outer layer. In other words, the semiconducting light emitting nanoparticle of the present invention optionally may comprise, essentially consisting of, or consisting of a core, one or more shell layers covering said core, an outer layer covering said shell layers in this sequence.

First Shell Layer

In some embodiments of the present invention, said shell layer comprises at least one metal cation and at least one divalent anion as described in the section of outer layer and/or at least a $1^{st}$ element of group 12 of the periodic table and a Se atom or a S atom, preferably, the $1^{st}$ element is Zn.

For example, said first shell layer is selected from the group consisting of $Cs_2S$, $Cs_2Se$, $Cs_2Te$, $Cs_2O$, $Ag_2S$, $Ag_2Se$, $Ag_2Te$, $Ag_2O$, $Au_2S$, $Au_2Se$, $Au_2Te$, $Au_2O$, $Cu_2S$, $Cu_2Se$, $Cu_2Te$, $Cu_2O$, ZnS, ZnSe, ZnTe, ZnO, CdS, CdSe, CdTe, CdO, CaS, CaSe, CaTe, CaO, NiS, NiSe, NiTe, NiO, MgS, MgSe, MgTe, MgO, HgS, HgSe, HgTe, HgO, PbS, PbSe, PbTe, PbO, CuS, CuSe, CuTe, CuO, CoS, CoSe, CoTe, CoO, SrO, SrS, SrSe, CoTe, SrO, FeS, FeSe, FeO, FeTe, $In_2S_3$, $In_2Se_3$, $In_2Te_3$, $In_2O_3$, $Ga_2S_3$, $Ga_2Se_3$, $Ga_2Te_3$, $Ga_2O_3$, $Bi_2S_3$, $Bi_2Se_3$, $Bi_2Te_3$, $Bi_2O_3$, $Fe_2S_3$, $Fe_2Se_3$, $Fe_2Te_3$, $Fe_2O_3$, $TiS_2$, $TiSe_2$, $TiTe_2$, $TiO_2$, $SiS_2$, $SiSe_2$, $SiTe_2$, $SiO_2$, $ZrS_2$, $ZrSe_2$, $ZrTe_2$, $ZrO_2$, $HfS_2$, $HfSe_2$, $HfTe_2$, $HfO_2$, $SnS_2$, $SnSe_2$, $SnTe_2$, $SnO_2$, $GeS_2$, $GeSe_2$, $GeTe_2$, GeO, CuInZnS, $CuInS_2$, CuInZnSe, $CuInSe_2$, AgInZnS, AgInZnSe, $CuGaZnS$, CuGaZnSe, $CuFeS_2$, $CuFeSe_2$ and a combination of any of these.

Preferably it is selected from the group consisting of ZnS, ZnSe, ZnTe, ZnO, CdS, CdSe, CdTe, CdO, CaS, CaSe, CaTe, CaO, NiS, NiSe, NiTe, NiO, MgS, MgSe, MgTe, MgO, HgS, HgSe, HgTe, HgO, PbS, PbSe, PbTe, PbO, CuS, CuSe, CuTe, CuO, CoS, CoSe, CoTe, CoO, SrO, SrS, SrSe, CoTe, SrO, FeS, FeSe, FeO, FeTe and a combination of any of these materials More preferably: ZnS, ZnSe, ZnTe, ZnO or a combination of any of these materials In a preferred embodiment of the present invention, the first shell layer can be represented by following formula (VII), $$ZnS_xSe_{(1-x-z)}Te_z, \quad (VII)$$

wherein $0 \leq x \leq 1$, $0 \leq z \leq 1$, and $x+z \leq 1$, preferably, the shell layer is ZnSe, ZnS, $ZnS_xSe_{(1-x)}ZnS_xSe_{(1-x)}Te_z$, more preferably it is ZnSe or ZnS.

In some embodiments of the present invention, said shell layer is an alloyed shell layer or a graded shell layer preferably said graded shell layer is ZnSe, $ZnS_xSe_{(1-x)}$, or $ZnS_xSe_{(1-x)}Te_z$, more preferably it is $ZnS_xSe_{(1-x)}$.

In some embodiments of the present invention, optionally, the first semiconducting nanoparticle as a core and a first shell layer can be at least partially embedded in the $2^{nd}$ shell, preferably said first semiconducting nanoparticle is fully embedded into the shell layer.

For example, said second shell layer is selected from the group consisting of $Cs_2S$, $Cs_2Se$, $Cs_2Te$, $Cs_2O$, $Ag_2S$, $Ag_2Se$, $Ag_2Te$, $Ag_2O$, $Au_2S$, $Au_2Se$, $Au_2Te$, $Au_2O$, $Cu_2S$, $Cu_2Se$, $Cu_2Te$, $Cu_2O$, ZnS, ZnSe, ZnTe, ZnO, CdS, CdSe, CdTe, CdO, CaS, CaSe, CaTe, CaO, NiS, NiSe, NiTe, NiO, MgS, MgSe, MgTe, MgO, HgS, HgSe, HgTe, HgO, PbS, PbSe, PbTe, PbO, CuS, CuSe, CuTe, CuO, CoS, CoSe, CoTe, CoO, SrO, SrS, SrSe, CoTe, SrO, FeS, FeSe, FeO, FeTe, $In_2S_3$, $In_2Se_3$, $In_2Te_3$, $In_2O_3$, $Ga_2S_3$, $Ga_2Se_3$, $Ga_2Te_3$, $Ga_2O_3$, $Bi_2S_3$, $Bi_2Se_3$, $Bi_2Te_3$, $Bi_2O_3$, $Fe_2S_3$, $Fe_2Se_3$, $Fe_2Te_3$, $Fe_2O_3$, $TiS_2$, $TiSe_2$, $TiTe_2$, $TiO_2$, $SiS_2$, $SiSe_2$, $SiTe_2$, $SiO_2$, $ZrS_2$, $ZrSe_2$, $ZrTe_2$, $ZrO_2$, $HfS_2$, $HfSe_2$, $HfTe_2$, $HfO_2$, $SnS_2$, $SnSe_2$, $SnTe_2$, $SnO_2$, $GeS_2$, $GeSe_2$, $GeTe_2$, $GeO$, $CuInZnS$, $CuInS_2$, CuInZnSe, $CuInSe_2$, AgInZnS, AgInZnSe, CuGaZnS, CuGaZnSe, $CuFeS_2$, $CuFeSe_2$ and a combination of any of these.

Preferably it is selected from the group consisting of ZnS, ZnSe, ZnTe, ZnO, CdS, CdSe, CdTe, CdO, CaS, CaSe, CaTe, CaO, NiS, NiSe, NiTe, NiO, MgS, MgSe, MgTe, MgO, HgS, HgSe, HgTe, HgO, PbS, PbSe, PbTe, PbO, CuS, CuSe, CuTe, CuO, CoS, CoSe, CoTe, CoO, SrO, SrS, SrSe, CoTe, SrO, FeS, FeSe, FeO, FeTe and a combination of any of these materials More preferably: ZnS, ZnSe, ZnTe, ZnO or a combination of any of these materials.

In some embodiments of the present invention, said $2^{nd}$ shell layer comprises at least a $1^{st}$ element of group 12 of the periodic table and a $2^{nd}$ element of group 16 of the periodic table, preferably, the $1^{st}$ element is Zn, and the $2^{nd}$ element is S, Se, O, or Te.

In a preferred embodiment of the present invention, the second shell layer is represented by following formula (VII'),

$$ZnS_xSe_{(1-x)}Te_z, \quad (VII')$$

wherein $0 \leq x \leq 1$, $0 \leq z \leq 1$, and $x+z \leq 1$, preferably, the shell layer is ZnSe, $ZnS_xSe_y$, $ZnSe_yTe_z$ or $ZnSxTe_z$, or ZnS, more preferably ZnSeS or ZnS In some embodiments of the present invention, said shell layer is an alloyed shell layer or a graded shell layer preferably said graded shell layer is $ZnS_xSe_y$, $ZnSe_yTe_z$, or $ZnS_xTe_z$, more preferably it is $ZnS_xSe_y$.

In some embodiments of the present invention, the concentration of Se in the shell layer varies from a high concentration of the first semiconducting nanoparticle side in the shell layer to a low concentration of the opposite side in the shell layer, more preferably, the concentration of S in the shell layer varies from a low concentration of first semiconducting nanoparticle side of the shell layer to a higher concentration to the opposite side of the shell layer, the concentration of Te in the shell layer varies from a high concentration of first semiconducting nanoparticle side of the shell layer to a lower concentration to the opposite side of the shell layer.

In some embodiments of the present invention, the composition of the $2^{nd}$ shell layer can be the same to the composition of the outer shell layer.

In some embodiments of the present invention, the semiconducting light emitting nanoparticle can further comprise one or more additional shell layers onto the $2^{nd}$ shell layer as a multishell.

According to the present invention, the term "multishell" stands for the stacked shell layers consisting of three or more shell layers.

In some embodiments of the present invention, the surface of the semiconducting light emitting nanoparticle can be over coated with one or more kinds of surface ligands in addition to the organic moiety of the present invention.

Without wishing to be bound by theory it is believed that such surface ligands may lead to disperse the nanosized fluorescent material in a solvent more easily.

The surface ligands in common use include phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), amines such as Oleylamine, Dodecyl amine (DDA), Tetradecyl amine (TDA), Hexadecyl amine (I), and Octadecyl amine (ODA), Oleylamine (OLA), 1-Octadecene (ODE), thiols such as hexadecane thiol, dodecane thiol, hexane thiol and polyethylene glycol thiols; selenols, when organic moiety of selenol may include linear or branched alkyl chain which can be saturated or include one or more unsaturated carbon bonds and/or aromatic rings; mercapto carboxylic acids such as mercapto propionic acid and mercaptoundecanoicacid; carboxylic acids such as oleic acid, stearic acid, myristic acid; acetic acid and a combination of any of these. Furthermore, the ligands can include Zn-oleate, Zn-acetate, Zn-myristate, Zn-Stearate, Zn-laurate and other Zn-carboxylates, sulfonic acids, halides, carbamates.

Examples of surface ligands have been described in, for example, the laid-open international patent application No. WO 2012/059931A.

In some embodiments of the present invention, the nanoparticle has a full width half maximum (FWHM) of at most 55 nm measured at 25° C. using a toluene solution, preferably a full width half maximum (FWHM) in the range of 30 to 55 nm, more preferably from 30 to 47 nm.

Determination of the Full Width Half Maximum (FWHM)

Preferably, the determination of the full width half maximum (FWHM) is made with an appropriate data base preferably comprising at least 10, more preferably at least 20 and even more preferably at least 50 data points. The determination is preferably performed by using LabVIEW Software (LabVIEW 2017; May 2017) with the following VIs (Virtual Instrument):

1. 'Peak detector for finding center wavelength and y-value (counts). The following parameters are preferably used: width: 10, threshold: maximum value of input data divided by 5.
2. Dividing the counts (y-value) at the center wavelength value (see item 1) by 2 giving the y-value for the half-width of the peak. The two points having this half-width y-value were found and the difference between their two wavelength values were taken to give the FWHM parameter.

Measurements of Quantum Yield

According to the present invention the QY is measured using Hamamatsu absolute quantum yield spectrometer (model: Quantaurus C11347).

Preferably, the nanoparticle emits light having the peak maximum light emission wavelength in the range from 350 nm 3500 nm, preferably from 350 nm to 2000 nm, more preferably from 400 nm to 800 nm, even more preferably from 430 nm to 700 nm.

Analysis of Nanoparticles, Preferably Quantum Dots (QDs) by GCMS

According to the present invention the gas chromatography mass spectrometry (GCMS) is performed using Agilent Technologies 7890B GC system equipped with autosampler and Agilent DB-5 column and MS instrument Agilent Technologies 5977B MSD. The analytes were separated using the following injection method: initial temperature 100° C., hold 0 min at 100° C.; heat to 340° C. at the rate of 8° C./min, hold 15 min at 340° C. Samples for GCMS are prepared as follows:

3.1 Weight the starting material.
3.2 Calculate the organic content based on TGA measurement.
3.3 For each 30 mg of organic component add 10 ml methanol and 5 ml of concentrated hydrochloric acid (caution! exothermic reaction) to dissolve the nanoparticles, preferably quantum dots (QDs). If the color still persists, use sonication and Vortex.
3.4 Place magnetic stirrer and heat the solution at 60° C. for 20 min (do not heat in closed flask! Make sure that the stopper is partially open)
3.5 Transfer the solution to separating funnel. Add toluene (10 ml for 30 mg of organic material).
3.6 Extract the water phase and remove the lower aqueous phase.
3.7 Add 20 ml distilled water to funnel and extract the toluene phase again.
3.8 Repeat the extraction of the toluene phase with water at least 3 times or until the water phase have the pH of distilled water (~5).
3.9 Collect the upper phase to a flask containing MgSO4 for at least 30 min. Filter the MgSO4 solids.
3.10 Transfer the toluene mixture to the GC vials for injection.

Process

According to the present invention, in one aspect, said process for fabricating a semiconducting nanoparticle, preferably a semiconducting light emitting nanoparticle comprising, essentially consisting of, or consisting of, at least following steps (a) a) mixing at least a semiconducting nanomaterial, preferably said semiconducting nanomaterial comprises at least a 1$^{st}$ semiconducting nanoparticle as a core, with another material to get a reaction mixture, preferably said another material is a solvent;

(b) forming an outer layer onto the semiconducting nanomaterial in the reaction mixture by reacting at least an anion source represented by chemical formula (Va) or/and chemical formula (Vb) with a metal cation precursor in a reaction mixture;

A-B-X-H  (Va)

A-B-X-X-B-A  (Vb)

wherein
A is an organic group;
B is a connecting unit connecting A and X;
H is a hydrogen atom; and
X is an anchor group comprising an anion, capable to form a monolayer with the added metal cation derivable from the added metal cation precursor;

(c) cooling the reaction mixture from step (b), wherein the reaction mixture in step (b) is kept at a temperature in the range from 80° C. to 200° C., preferably in the range from 100 to 200° C., to form the outer layer in step (b).

As an anion source, preferably an organic moiety of chemical formula (II'), (III'), (IIIa') or (IV'),

L-(U)$_o$—(Y)$_m$—(CH$_2$)$_n$—X$^1$  (II')

wherein
L is an organic group, preferably said organic group is hydrocarbyl (alkyl, aryl, aralkyl and alkylaryl), heteroaromatic group, including aryl, alkaryl, alkyl or aralkyl, alkylamine, fluoroaryl, fluoroalkaryl, fluoroalkyl, fluoroaralkyl, heteroaromatic group, including fluoroaryl, fluoroalkaryl, fluoroalkyl or fluoroaralkyl;
U is O, CH$_2$ or C=O;
Y is O, CH$_2$ or C=O;
n is an integer 1 or more;
m is 0 or an integer 1 or more, preferably m is 1;
o is 0 or an integer 1 or more, preferably o is 1;
X$^1$ is an anchor group comprising at least a divalent anion being capable to attach to said metal cation preferably by covalent bond, selected from one or more members of the group consisting of Se$^{2-}$, S$^{2-}$, Te$^{2-}$ O$^{2-}$,

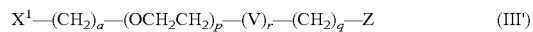

X$^1$—(CH$_2$)$_a$—(OCH$_2$CH$_2$)$_p$—(V)$_r$—(CH$_2$)$_q$—Z  (III')

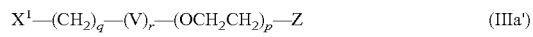

X$^1$—(CH$_2$)$_q$—(V)$_r$—(OCH$_2$CH$_2$)$_p$—Z  (IIIa')

wherein
X$^1$ is an anchor group comprising at least a divalent anion being capable to attach to said metal cation, selected from one or more member of the group consisting of Se$^{2-}$, S$^{2-}$, Te$^{2-}$ O$^{2-}$;
V is O, CH$_2$ or C=O;
Z is a hydrogen atom or an organic group, preferably Z is a hydrogen atom, a straight alkyl group having 1 to 25 carbon atoms, a branched alkyl group having 3 to 25 carbon atoms, —COOH, —SH, or —NH$_2$, alkylamine, fluoroaryl, fluoroalkaryl, fluoroalkyl, fluoroaralkyl, heteroaromatic group, including fluoroaryl, fluoroalkaryl, fluoroalkyl or fluoroaralkyl, preferably Z is a hydrogen atom, a straight alkyl group having 1 to 25 carbon atoms, a branched alkyl group having 3 to 25 carbon atoms, more preferably it is a hydrogen atom, a straight alkyl group having 1-15 carbon atoms, a branched alkyl group having 3-15 carbon atoms, even more preferably it is a hydrogen atom, or a straight alkyl group having 1-10 carbon atoms;
a is 0 or an integer 1 or more, preferably 0≤a≤25, more preferably 0≤a≤15, even more preferably 1≤a≤10;
p is 0 or an integer 1 or more, preferably 0≤p≤45, more preferably 0≤p≤25, even more preferably 1≤p≤20, furthermore preferably 4≤p≤18;
q is 0 or an integer 1 or more, preferably 0≤q≤25, more preferably 0≤q≤15, even more preferably 0≤q≤10, furthermore preferably it is 15;
r is 0 or an integer 1;

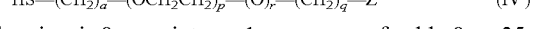

HS—(CH$_2$)$_a$—(OCH$_2$CH$_2$)$_p$—(O)$_r$—(CH$_2$)$_q$—Z'  (IV')

wherein a is 0 or an integer 1 or more, preferably 0≤a≤25, more preferably 0≤a≤15, even more preferably 1≤a≤10;
p is 0 or an integer 1 or more, preferably 0≤p≤45, more preferably 0≤p≤25, even more preferably 1≤p≤20, furthermore preferably 4≤p≤18;
q is 0 or an integer 1 or more, preferably 0≤q≤25, more preferably 0≤q≤15, even more preferably 0≤q≤10, furthermore preferably it is 1;
Z' is a hydrogen atom a straight alkyl group having 1 to 25 carbon atoms, a branched alkyl group having 3 to 25 carbon atoms, alkylamine, fluoroaryl, fluoroalkaryl, fluoroalkyl, fluoroaralkyl, heteroaromatic group, including fluoroaryl, fluoroalkaryl, fluoroalkyl or fluoroaralkyl, preferably Z' is a straight alkyl group having 1 to 25 carbon atoms, a branched alkyl group having 3 to 25 carbon atoms or a hydrogen atom, more preferably it is a straight alkyl group having 1-15 carbon atoms, a branched alkyl group having 3-15 carbon atoms or a hydrogen atom, even more preferably it is a hydrogen atom;

r is 0 or an integer 1.

For examples, following materials can be used as the anion source preferably.

$SH-CH_2-(OCH_2CH_2)_4-O-CH_3$
$SH-CH_2-(OCH_2CH_2)_6-O-CH_3$
$SH-CH_2-(OCH_2CH_2)_8-O-CH_3$
$SH-(CH_2)_2-(OCH_2CH_2)_2-O-CH_3$
$SH-(CH_2)_2-(OCH_2CH_2)_6-O-CH_3$
$SH-(CH_2)_2-(OCH_2CH_2)_8-O-CH_3$
$SH-(CH_2)_2-(OCH_2CH_2)_6-CH_3$
$SH-(CH_2)_2-(OCH_2CH_2)_6-O-(CH_2)_2-SH$
$SH-(CH_2)_7-CH_3$
$SeH-(CH_2)_7-CH_3$
$SH-(CH_2)_{11}-CH_3$
$SeH-(CH_2)_{11}-CH_3$
$SH-(CH_2)_{17}-CH_3$
$SeH-(CH_2)_{17}-CH_3$
$SH-(CH_2)_2-(OCH_2CH_2)_6-O-CHs$
$SH-(CH_2)_2-(OCH_2CH_2)_{16}-O-CHs$
$SH-(CH_2)_2-(OCH_2CH_2)_{17}-O-CHs$

In some embodiments, said organic moiety of chemical formula (I), (II) can be an organic moiety represented by following chemical formula Ia, Ib, Ic, Id, Ie, IIa, IIb, IIc, IId, IIe, IIf, IIg, IIh, IIi or IIj;

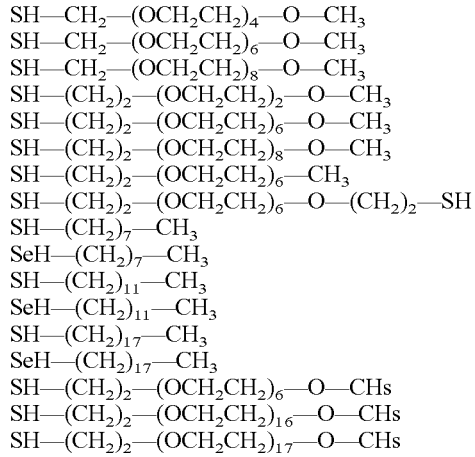

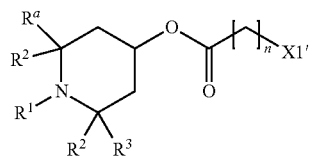

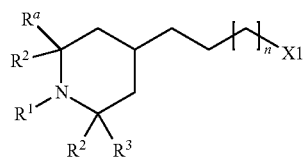

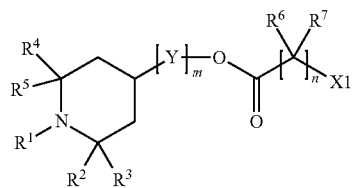

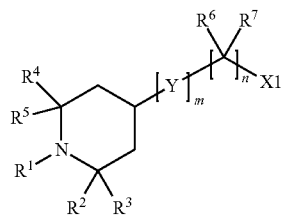

wherein Y is a divalent bond, m is o or 1, R6 is a hydrogen atom or R1, R7 is a hydrogen atom or R1.

$R^1$, and $R^5$ are at each occurrence, independently or dependently of each other, an alkyl group having 1 to 18 carbon atoms, cycloalkyl having 5 to 12 carbon atoms, alkenyl having 2 to 18 carbon atoms, cycloalkenyl having 5 to 12 carbon atoms, aralkyl having 7 to 15 carbon atoms, a radical of a saturated or unsaturated bicyclic or tricyclic hydrocarbon having 7 to 12 carbon atoms or aryl having 6 to 10 carbon atoms or said aryl substituted by alkyl, or $OR^x$;

$R^x$ is an alkyl group having 1 to 18 carbon atoms, cycloalkyl having 5 to 12 carbon atoms, alkenyl having 2 to 18 carbon atoms, cycloalkenyl having 5 to 12 carbon atoms, aralkyl having 7 to 15 carbon atoms, a radical of a saturated or unsaturated bicyclic or tricyclic hydrocarbon having 7 to 12 carbon atoms or aryl having 6 to 10 carbon atoms or said aryl substituted by alkyl;

$R_2$ is a hydrogen atom or $R_3$;

$R^a$ is an alkyl group having 1 to 36 carbon atoms, preferably selected from methyl, ethyl, propyl, butyl, pnetyl, hexyl, octyl, decyl, tetradecyl, hexadecyl, eicosyl, docosyl, pentacosyl, heptacosyl, triacontyl, dotriacontyl, tetratriacontyl, hexatriacontyl and branched isomers thereof;

$R^3$ is a cycloalkyl group having 5 to 12 carbon atoms, phenyl or naphthyl, which is unsubstituted or substituted by alkyl of 1 to 36 carbon atoms or aralkyl having 7 to 9 carbon atoms which is unsubstituted or substituted by alkyl having 1 to 36 carbon atoms.

$R^4$ is an alkyl group having 1 to 36 carbon atoms, preferably selected from methyl, ethyl, propyl, butyl, pentyl, hexyl, octyl, decyl, tetradecyl, hexadecyl, eicosyl, docosyl, pentacosyl, heptacosyl, triacontyl, dotriacontyl, tetratriacontyl, hexatriacontyl and branched isomers thereof;

X1 is an anchor group selected from Se—H (selenol), S—H (thiol), Te—H(tellurol) or a combination of any of these;

n is zero or an integer;

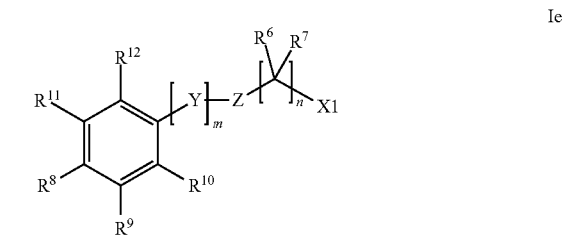

wherein

Z is a divalent bond, preferaby it is selected from a substituted or unsubstituted straight alkyelene group having 1 to 10 carbon atoms, a substituted or unsubstitued alkoxylene group having 1 to 10 carbon atoms, Y is a connecting unit;

m is 0 or 1;

$R^6$ is a hydrogen atom or $R^1$;

$R^7$ is a hydrogen atom or $R^1$;

$R^{12}$ is a hydrogen atom or R1;

R

In some embodiments, the organic moiety represented by chemical formula II) is an organic moiety represented by IIa', IIb', IIc', IId', IIe', IIf', IIg', IIh', IIi' or IIj';

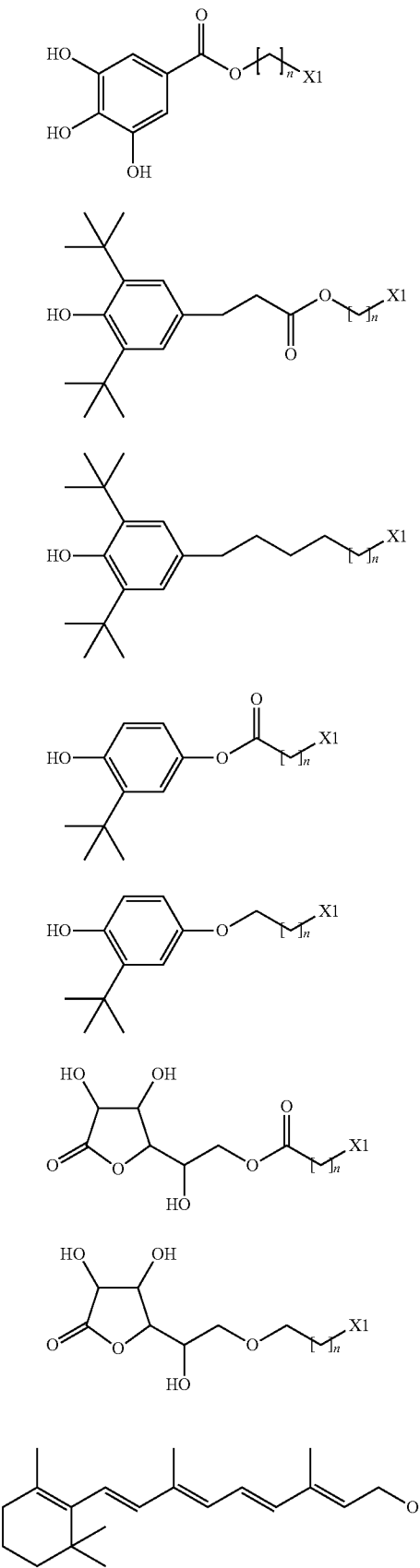

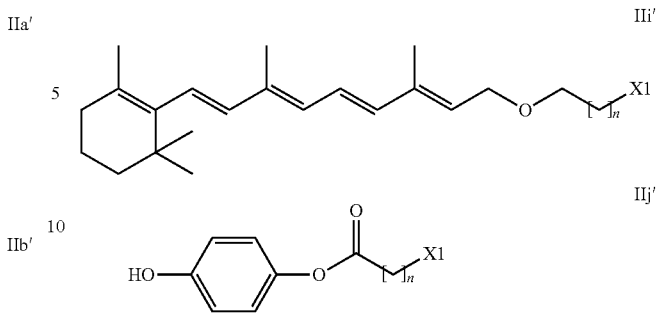

X1 is an anchor group selected from Se—H (selenol), S—H (thiol), Te—H(tellurol), O—H (alcohol) or a combination of any of these;

n is zero or an integer.

It is believed that the temperature ranges from 80° C. to 200° C. is important to make a crystal binding between the organic moiety and the outer layer. In other words, by keeping the reaction temperature in step (b) within the temperature range, the anchor group of chemical formula (I), (II), (III) and/or (IV) is being attached to a cation to form the outer layer, while the organic moiety is kept attached to the anchor group by covalent bond In a preferred embodiment of the present invention, an injection of said anion source is carried out at the temperature in the range from 0° C. to 200° C., preferably in the range from 20° C. to 180° C. in step (a) or in step (b).

It is believed that the temperature range of the injection is also important to prevent X-B bond breakage.

Preferably, step (b) is carried out in the range from 1 minute to 10 hours, preferably from 10 minutes to 5 hours, more preferably 20 minutes to 3 hours.

According to the present invention, preferably, the ratio of the total molar amount of the cation precursor to the total molar amount of the semiconducting nanoparticle in step (b) is in the range from 20:1 to 200000:1, preferably from 100:1 to 60000:1, more preferably 110:1 to 58000:1, even more preferably 120:1 to 5000:1.

In a preferred embodiment of the present invention, the ratio of the total molar amount of the chalcogen source to the total molar amount of the semiconducting nanoparticle in step (b) is in the range from 20:1 to 200000:1, preferably from 100:1 to 60000:1, more preferably 110:1 to 58000:1, even more preferably 120:1 to 5000:1.

In some embodiments of the present invention, a anion source represented by chemical formula (2) can be used singly or in combination with any other chalcogen source as the anion source in step (b) to form the outer layer.

$$L^1\text{-}U^1\text{—}Y^1\text{—}(CH_2)_n\text{—}Z^1\text{-}Z^2\text{—}(CH_2)_n\text{—}Y^2\text{—}U^2\text{-}L^2 \qquad (2)$$

$L^1$ and $L^2$ are each independently or dependently of each other, an organic group, preferably said organic group is a hydrocarbyl (alkyl, aryl, aralkyl and alkylaryl) group, including aryl, alkaryl, alkyl or aralkyl;

$U^1$ and $U^2$ are at each occurrence, independently or dependently of each other, O, —$CH_2$— or C=O;

$Y^1$ and $Y^2$ are at each occurrence, independently or dependently of each other, O, —$CH_2$— or C=O;

n is an integer 1 or more;

$Z^1$ is a divalent anion selected from Se, S, Te, O;

$Z^2$ is a divalent anion selected from Se, S, Te, O.

In a preferred embodiment of the present invention, the ratio of the total amount of the anion source and the total amount of the cation precursor used in step (b) is in the range from 20:1 to 1:20, preferably in the range from 12:1 to 1:12, even more preferably 5:1 to 1:5.

Chalcogen Source

According to the present invention, the term "chalcogen" means a chemical element of the group 16 chemical elements of the periodic table, preferably it is sulfur (S), selenium (Se), oxygene (O) and/or tellurium (Te)

Thus, according to the present invention, the term "chalcogen source" means a material containing at least one chemical element of the group 16 chemical elements of the periodic table, preferably said chemical element of the group 16 chemical elements is oxygen (O), sulfur (S), selenium (Se), and/or tellurium (Te), more preferably it is sulfur (S), or selenium (Se).

In a preferred embodiment of the present invention, said chalcogen source is a selenium source, sulfur source or a combination of selenium source and a selenium source. More preferably, it is selected from selenols, diselenides, thiols, disulphides or a combination of these, Step (a)—Mixing In a preferred embodiment of the present invention, step (a) is carried out in an inert condition such as under Argon (Ar) or $N_2$ condition, more preferably under Ar condition.

In a preferred embodiment of the present invention, said another material used in step (a) is a solvent, more preferably it is an organic solvent, even more preferably it is selected from one or more members of the group consisting of squalenes, squalanes, heptadecanes, octadecanes, octadecenes, nonadecanes, icosanes, henicosanes, docosanes, tricosanes, pentacosanes, hexacosanes, octacosanes, nonacosanes, triacontanes, hentriacontanes, dotriacontanes, tritriacontanes, tetratriacontanes, pentatriacontanes, hexatriacontanes, oleylamines, trioctylamines, ketones, ketones ether acetates such as PGMEA, nitriles, ethers, etheric esters, aromatic solvents such as toluene, xylenes, ethylbenzene, diethylbenzes, isopropylbenzene, diisopropylbenzenes, mesitylene, with preferably being of squalene, squalane, heptadecane, octadecane, octadecene, nonadecane, icosane, henicosane, docosane, tricosane, pentacosane, hexacosane, octacosane, tetracosane, nonacosane, triacontane, hentriacontane, dotriacontane, tritriacontane, tetratriacontane, pentatriacontane, hexatriacontane, oleylamine, trioctylamines, ketones, ketones ether acetates such as PGMEA, nitriles, ethers, aromatic solvents such as toluene, xylenes, ethylbenzene, diethylbenzes, isopropylbenzene, diisopropylbenzenes, mesitylene, more preferably octadecenes, oleylamine, squalane, pentacosane, hexacosane, octacosane, nonacosane, trioctylamine or triacontane, ketones, ketones, ether acetates such as PGMEA, nitriles, ethers, etheric esters, aromatic solvents such as toluene, xylenes, ethylbenzene, diethylbenzes, isopropylbenzene, diisopropylbenzenes, mesitylene, even more preferably octadecene, oleylamine, squalane, pentacosane, trioctylamine or hexacosane, tetracosane, ketones, ketones ether acetates such as PGMEA, etheric esters, nitriles, ethers, aromatic solvents such as toluene, xylenes, ethylbenzene, diethylbenzes, isopropylbenzene, diisopropylbenzenes, mesitylene.

In a preferred embodiment of the present invention, said mixing step is carried out at the temperature in the range of from 0° C. to 100° C., preferably from 5 to 60° C., more preferably from 10 to 40° C.

In a preferred embodiment of the present invention, a plurality of first semiconducting nanomaterials can be used in step (a).

Semiconducting Nanoparticle

According to the present invention, said semiconducting nanomaterial comprises, essentially consists of, or consists of at least a first semiconducting nanomaterial except for any ligand attached onto the outermost surface of the semiconducting nanoparticle if it is attached.

In some embodiments of the present invention, said semiconducting nanoparticle may optionally comprise one or more of shell layers covering at least a part of said first semiconducting nanoparticle as described in the section of "shell layer" above.

First Semiconducting Nanomaterial

According to the present invention, several kinds of first semiconducting nanomaterials can be used as a core in step (a), for example, CdS, CdSe, CdTe, ZnS, ZnSe, ZnSeS, ZnTe, ZnO, GaAs, GaP, GaSb, CuS, $Cu_2S$, CuSe, $Cu_2Se$, FeS, FeSe, FeO, FeTe HgS, HgSe, HgSe, HgTe, InAs, InxGa1-xAs, InP, InP:Zn, InP:ZnS, InP:ZnSe, InP:ZnSSe, InP:Ga,or InP:Ga, InSb InPS, InPZnS, InPSe, InPZn, InPZnSe, InPZnSeS, InPGa, InPGaZn, InP/ZnSe, In/ZnS, InZnP/ZnSe, InP/ZnSeTe, InZnP/ZnSeTe, InGaP/ZnSe, InP/InGaP, InZnP/InGaP, InCdP, InPCdS, InP/ZnSeS, InZnP/ZnSeS, InZnP/ZnS, InZnP/InGaP/ZnSe, InZnP/InGaP/ZnS, InZnP/InGaP/ZnSeS, InPCdSe, InGaP, InGaPZn, InSb, AlAs, AlP, AlSb, $Cu_2S$, $Cu_2Se$, $CuInS_2$, $CuInSe_2$, CuInZnS and a combination of any of these.

In some embodiments the core is a metal oxide comprising for example ZnO, FeO, $Fe_2O_3$, $ZrO_2$, CuO, SnO $Cu_2O$, $TiO_2$, $WO_3$, $HfO_2$, $In_2O_3$, MgO, $Al_2O_3$ and any combination of these.

In some embodiments the core comprises a metal, for example Au, Ag, W, Pd, Pt, Cu, In, Ti, Zn, Pb, Al, Cd, Zn and a combination of any of these.

In some embodiments of the present invention, the first semiconducting nanomaterial comprises, essentially consisting of, or consisting of, at least a first element of group 12 or group 13 elements of the periodic table and a second element of group 15 or 16 elements of the periodic table, preferably said first element is an element of group 13 elements of the periodic table and said second element is an element of group 15 elements of the periodic table, more preferably the first element is In, Ga or a combination of In and Ga, the second element is P, except for ligands attached onto the outermost surface of the first semiconducting nanoparticle if it is attached.

In a preferred embodiment of the present invention, the first semiconducting nanomaterial can further comprise additional element selected from one or more member of the group consisting of Ga, Zn, S, and Se.

In a preferred embodiment of the present invention, said first semiconducting nanomaterial is selected from the group consisting of InP, InP:Zn, InP:ZnS, InP:ZnSe, InP:ZnSSe, InP:Ga,or InP:GaZn, InP/ZnSe, InP/ZnS, InP/ZnSeS, InZnP/ZnSe, InZnP/ZnSeS, InZnP/ZnS, InGaP/ZnSe, InP/InGaP, InZnP/InGaP, InZnP/InGaP/ZnSe, InZnP/InGaP/ZnS, or InZnP/InGaP/ZnSeS.

In a preferable embodiment, the first semiconducting nanomaterial is alloyed.

According to the present invention, a type of shape of the first semiconducting nanomaterial of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, multipod shaped such as tetrapod shaped, tetrahedron shaped, platelet shaped, cone shaped, and irregular shaped first semiconducting nanoparticle and—or a semiconducting light emitting material can be synthesized.

In some embodiments of the present invention, the average diameter of the first semiconducting nanoparticle is in the range from 1 to 20 nm, preferably from 1.5 nm to 12 nm.

Optional Step (d)—Shell Formation

According to the present invention, a shell layer can be further formed optionally by applying following step (d), preferably step (d) is performed before step (b);

(d) mixing at least a semiconducting nanomaterial and/or a first semiconducting nanoparticle (core), preferably said first semiconducting nanoparticle is obtained in the step (h), and at least a first cation shell precursor and a first anion shell precursor, optionally in a solvent, to form a shell layer onto the first semiconducting material, Preferably said first anion shell precursor is injected into the reaction mixture during step (d).

In a preferred embodiment of the present invention, and preferably said anion precursor is a chalcogen source, more preferably it is selected from one or more members of the group consisting of Trioctylphosphine:Se, Tributylphosphine:Se, Trioctylphosphine:S, Tributylphosphine:S, thiols and selenols.

Other conditions for formation of a shell layer is described, for example in U.S. Pat. No. 8,679,543 B2 and Chem. Mater. 2015, 27, pp 4893-4898.

Nanoparticles can be obtained from public source or obtained as described in this patent application.

In a preferred embodiment of the present invention, said cation shell precursor is a salt of an element of the group 12 of the periodic table, more preferably said cation shell precursor is selected from one or more members of the group consisting of Zn-stearate, Zn-myristate, Zn-oleate, Zn-laurate, Zn-palmitate, Zn-acetylacetonate, Zn-undecylenate, Zn-Acetate, Cd-stearate, Cd-myristate, Cd-oleate, Cd-laurate, Cd-palmitate, Cd-acetylacetonate, Cd-undecylenate, Cd-acetate, a metal halogen represented by chemical formula (XIII) and a metal carboxylate represented by chemical formula (XIV),

$$MX^3{}_n \quad \quad (XIII)$$

wherein M is $Zn^{2+}$, or $Cd^{2+}$, preferably M is $Zn^{2+}$, $X^3$ is a halogen selected from the group consisting of F−, Cl−, Br− and I−, n is 2,

$$[M(O_2CR^{16})(O_2CR^{17})] \quad \quad (XIV)$$

wherein M is $Zn^{2+}$, or $Cd^{2+}$, preferably M is $Zn^{2+}$;

$R^{16}$ is a linear alkyl group having 1 to 30 carbon atoms, a branched alkyl group having 3 to 30 carbon atoms, a linear unsaturated hydrocarbyl group having 2 to 30 carbon atoms, or a branched unsaturated hydrocarbyl group having 3 to 30 carbon atoms, preferably $R^{16}$ is a linear alkyl group having 1 to 30 carbon atoms, or a linear unsaturated hydrocarbyl group having 2 to 30 carbon atoms, more preferably, $R^{16}$ is a linear alkyl group having 2 to 25 carbon atoms, or a linear unsaturated hydrocarbyl group having 6 to 25 carbon atoms, even more preferably $R^{16}$ is a linear alkyl group having 2 to 20 carbon atoms, or a linear unsaturated hydrocarbyl group having 10 to 20 carbon atoms, furthermore preferably $R^{16}$ is a linear alkyl group having 2 to 20 carbon atoms, $R^{17}$ is a linear alkyl group having 1 to 30 carbon atoms, a branched alkyl group having 3 to 30 carbon atoms, a linear unsaturated hydrocarbyl group having 2 to 30 carbon atoms, or a branched unsaturated hydrocarbyl group having 43 to 30 carbon atoms, preferably $R^{17}$ is a linear alkyl group having 1 to 30 carbon atoms, or a linear unsaturated hydrocarbyl group having 2 to 30 carbon atoms, more preferably $R^{17}$ is a linear alkyl group having 2 to 25 carbon atoms, or a linear unsaturated hydrocarbyl group having 6 to 25 carbon atoms, even more preferably $R^{17}$ is a linear alkyl group having 2 to 20 carbon atoms, or a linear unsaturated hydrocarbyl group having 10 to 20 carbon atoms, furthermore preferably $R^{17}$ is a linear alkyl group having 2 to 20 carbon atoms.

In a preferred embodiment, $R^{16}$ and $R^{17}$ are the same.

In a preferred embodiment of the present invention, the ratio of the total amount of the chalcogen source, preferably said chalcogen source is a selenium source, sulfur source or a combination of selenium source and a sulphur source, and the total amount of the cation shell precursor used in step (d) is in the range from 20:1 to 1:20, preferably in the range from 12:1 to 1:12.

Step (d) can be applied for synthesizing not only a first shell layer but also a second shell layer and/or a multishell layer.

Cooling Step (e)

According to the present invention, cooling the reaction mixture from step (d) is carried out in step (e) after step (d) before step (b), preferably to stop shell forming reaction accordingly.

As a cooling method, several methods can be used singly or in combination.

Such as removing a heat source, injecting a solvent such as a solvent at a room temperature, and/or applying air cooling.

In some embodiment, the cooling rate in step (e) can be in the range from 0.03° C./s to 50° C./s, preferably it is from 0.1° C./s to 10° C./s.

In a preferred embodiment, the reaction mixture is cooled down to the temperature less than 200° C., more preferably in the rage from 200° C. to 0° C., Step (f)—Mixing Step to Make a Second Mixture In some embodiments of the invention, the process further comprises step (f), preferably the process comprises step (f) before step (b), more preferably after step (d) before step (b), even more preferably after step (e) before step (b).

(f) mixing said chalcogen source and said cation precursor with the first semiconducting nanoparticle, optionally with another material, to make the second mixture at the temperature in the range of from 0° C. to 100° C., preferably from 5 to 60° C., more preferably from 10 to 40° C.

In some embodiments, as an option, premixing the first semiconducting nanoparticle and the cation source to make a premixed mixture and then injecting the chalcogen source to the premixed mixture can be done as step (f″) instead of said step (f) to make the second mixture. The same temperature range as described in step (e) can be applied.

Preferably, said chalcogen source is injected after injection of said cation shell precursor.

In some embodiments of the invention, to obtain the semiconductor nanoparticles, the process may optionally comprise process steps like described in but not limited to the following steps (g) and (h) in this sequence, preferably before step (a);

(g) preparing a first semiconducting nanoparticle in a first mixture by reacting at least one indium precursor and at least one phosphor precursor or by using a cluster being obtainable by reacting the metal cation precursor and the anion precursor, preferably said cluster is a magic sized cluster, said indium precursor is a metal halide represented by following chemical formula (XV), metal carboxylate represented by following chemical formula (XVI), or a combination of these, and said phosphor precursor is an amino phosphine represented by following chemical formula (XVII), alkyl silyl phosphine such as tris trimethyl silyl phosphine, or a combination of these, $$InV^1_3 \quad (XV)$$

wherein $V^1$ is a halogen selected from the group consisting of $Cl^-$, $Br^-$ and $I^-$, $$[In(O_2CR^3)_3] \quad (XVI)$$

wherein $R^3$ is a linear alkyl group having 1 to 30 carbon atoms, a branched alkyl group having 3 to 30 carbon atoms, a linear unsaturated hydrocarbyl group having 2 to 30 carbon atoms, or a branched unsaturated hydrocarbyl group having 3 to 30 carbon atoms, preferably $R^3$ is a linear alkyl group having 1 to 30 carbon atoms, or a linear unsaturated hydrocarbyl group having 2 to 30 carbon atoms, more preferably, $R^3$ is a linear alkyl group having 5 to 25 carbon atoms, or a linear unsaturated hydrocarbylgroup having 6 to 25 carbon atoms, even more preferably $R^3$ is a linear alkyl group having 10 to 20 carbon atoms, or a linear unsaturated hydrocarbylgroup having 10 to 20 carbon atoms, furthermore preferably $R^3$ is a linear alkyl group having 10 to 20 carbon atoms, $$(R^4R^5N)_3P \quad (XVII)$$

wherein $R^4$ and $R^5$ are at each occurrence, independently or dependently, a hydrogen atom or a linear alkyl group having 1 to 25 carbon atoms or a linear unsaturated hydrocarbylgroup having 2 to 25 carbon atoms, preferably a linear alkyl group having 1 to 10 carbon atoms, more preferably a linear alkyl group having 2 to 4 carbon atoms, even more preferably a linear alkyl group having 2 carbon atoms, optionally, a zinc salt and/or a zinc carboxylate is added in step (f), preferably said zinc salt is represented by following chemical formula (XIII), (XIV')

$$ZnX^3n \quad (XIII)$$

wherein $X^3$ is a halogen selected from the group consisting of $Cl^-$, $Br^-$ and $I^-$, n is 2, $$[Zn(O_2CR^1)(O_2CR^2)] \quad (XIV')$$

wherein
$R^1$ is a linear alkyl group having 1 to 30 carbon atoms, a branched alkyl group having 3 to 30 carbon atoms, a linear unsaturated hydrocarbylgroup having 2 to 30 carbon atoms, or a branched unsaturated hydrocarbylgroup having 3 to 30 carbon atoms, preferably $R^1$ is a linear alkyl group having 1 to 30 carbon atoms, or a linear unsaturated hydrocarbylgroup having 2 to 30 carbon atoms, more preferably, $R^1$ is a linear alkyl group having 5 to 25 carbon atoms, or a linear unsaturated hydrocarbylgroup having 6 to 25 carbon atoms, even more preferably $R^1$ is a linear alkyl group having 10 to 20 carbon atoms, or a linear unsaturated hydrocarbylgroup having 10 to 20 carbon atoms, furthermore preferably $R^1$ is a linear alkyl group having 10 to 20 carbon atoms,
$R^2$ is a linear alkyl group having 1 to 30 carbon atoms, a branched alkyl group having 3 to 30 carbon atoms, a linear unsaturated hydrocarbyl group having 2 to 30 carbon atoms, or a branched unsaturated hydrocarbyl group having 3 to 30 carbon atoms, preferably $R^2$ is a linear alkyl group having 1 to 30 carbon atoms, or a linear unsaturated hydrocarbyl group having 2 to 30 carbon atoms, more preferably $R^2$ is a linear alkyl group having 5 to 25 carbon atoms, or a linear unsaturated hydrocarbyl group having 6 to 25 carbon atoms, even more preferably $R^2$ is a linear alkyl group having 10 to 20 carbon atoms, or a linear unsaturated hydrocarbyl group having 10 to 20 carbon atoms, furthermore preferably $R^2$ is a linear alkyl group having 10 to 20 carbon atoms.

$R^1$ and $R^2$ can be the same or different.

(h) quenching the formation of the first semiconducting nanoparticle by cooling the first mixture in step (f).

Clusters Used in Step (g)

In some embodiments of the present invention, the first semiconducting nanoparticle in step (g) is prepared in a first mixture by using a cluster being obtainable by reacting the metal cation precursor and the anion precursor.

In some embodiments of the present invention, the first semiconducting nanoparticle in step (g) is prepared in a first mixture by using the cluster, and the cluster is a Magic Sized Cluster (MSC) selected from the group consisting of InP, InAs, InSb, GaP, GaAs, and GaSb, magic sized clusters (MSC), preferably InP magic sized cluster (MSC InP), more preferably, it is $In_{37}P_{20}(O_2CR^4)_{51}$, wherein said $O_2CR^4$ of said $In_{37}P_{20}(O_2CR^4)_{51}$ is $—O_2CCH_2Phenyl$, or a substituted or unsubstituted fatty acid such as hexanoate, heptanoate, octanoate, nonanoate, decanoate, undecanoate, dodecanoate, tridecanoate, tetradecanoate, pentadecanoate, hexadecanoate, heptadecanoate, octadecanoate, nonadecanoate, icosanoate or oleate.

In some embodiments of the present invention, the first semiconducting nanoparticle in step (g) may optionally be prepared in a first mixture by using the cluster, and the cluster is a Magic Sized Cluster (MSC), but not limited to it.

Preferably, the magic sized cluster (MSC) is based on a nanocrystal core, which consists solely of fused 6-membered rings with all phosphorus atoms coordinated to four indium atoms in a pseudo-tetrahedral arrangement, preferably the nanocrystal core have the formula $[In_{21}P_{20}]^{3+}$, $[In_{42}P_{40}]^{6+}$, $[In_{63}P_{60}]^{9+}$, $[In_{84}P_{80}]^{12+}$, $[In_{95}P_{30}]^{3+}$, $[In_{31}P_{30}]^{3+}$, $[In_{41}P_{40}]^{3+}$, $[In_{51}P_{50}]^{3+}$, $[In_{61}P_{60}]^{3+}$, $[In_{71}P_{70}]^{3+}$, $[In_{81}P_{80}]^{3+}$, and/or $[In_{91}P_{90}]^{3+}$.

In some embodiments of the present invention, the first semiconducting nanoparticle in step (g) is prepared in a first mixture by using the cluster, and the cluster is a Magic Sized Cluster (MSC), wherein the magic sized cluster (MSC) comprises an Indium based carboxylate ligand, preferably $In(O_2CR^9)_3$, wherein said $O_2CR^9$ of said $In(O_2CR^9)_3$ is $—O_2CCH_2Phenyl$, or a substituted or unsubstituted fatty acid such as hexanoate, heptanoate, octanoate, nonanoate, decanoate, undecanoate, dodecanoate, tridecanoate, tetradecanoate, pentadecanoate, hexadecanoate, heptadecanoate, octadecanoate, nonadecanoate, icosanoate or oleate. Such InP magic sized clusters (MSCs) as single source precursors (SSP) can be fabricated as described in D. Gary et al., Chem. Mater., 2015, 27, 1432.

Step (h)—Quenching Step

According to the present invention, the quenching of the formation of the first semiconducting nanoparticle can be done by cooling the reaction mixture.

As a cooling method, several methods can be used singly or in combination.

Such as removing a heat source, injecting a solvent such as a solvent at a room temperature, and/or applying air cooling.

In a preferred embodiment of the present invention, the cooling rate in step (h) is in the range from 0.01° C./s to 10° C./s, preferably it is from 0.05° C./s to 6° C./s, more preferably from 0.05° C./s to 5° C./s, more preferably it is from 0.1° C./s to 1° C./s, even more preferably it is from 0.2° C./s to 0.7° C./s.

Step (j)—Surface Treatment Process

In some embodiments of the present invention, the process further comprises following step (j) before step (a), preferably before step (a) after step (h), (j) subjecting said a first semiconducting nanoparticle to a surface treatment with a metal halide represented by following chemical formula (VIII), or with an alkyl ammonium halide,

$$MX^3{}_n \quad \quad \quad \text{(VIII)}$$

wherein M is $Zn^{2+}$, or $Cd^{2+}$, preferably M is $Zn^{2+}$, $X^3$ is a halogen selected from the group consisting of F-, Cl-, Br- and I-, n is 2.

In some embodiments of the present invention, the step (h) is carried out at the temperature in the range from 150° C. to 350° C., preferably in the range from 200° C. to 320° C., more preferably in the range from 250° C. to 300° C., even more preferably from 250° C. to 280° C.

In some embodiments of the present invention, the treatment time of step (j) is in the range from 10 minutes to 10 hours, preferably from 20 minutes to 4 hours, more preferably 30 minutes to 3 hours.

In some embodiments of the present invention, the total molar ratio between the amount of the metal halide in step (j) and the amount of the first semiconducting nanoparticle is in the range from 500 to 50,000, preferably from 1,000 to 20,000, more preferably from 1400 to 10,000.

In some embodiments of the present invention, step (j) is carried out in a solution comprising at least one solvent selected from one or more members of the group consisting of squalenes, squalanes, heptadecanes, octadecanes, octadecenes, nonadecanes, icosanes, henicosanes, docosanes, tricosanes, pentacosanes, hexacosanes, octacosanes, nonacosanes, triacontanes, hentriacontanes, dotriacontanes, tritriacontanes, tetratriacontanes, pentatriacontanes, hexatriacontanes, oleylamines, trioctylamines, ketones, ketones ether acetates such as PGMEA, nitriles, ethers, aromatic solvents, with preferably being of squalene, squalane, heptadecane, octadecane, octadecene, nonadecane, icosane, henicosane, docosane, tricosane, pentacosane, hexacosane, octacosane, nonacosane, triacontane, hentriacontane, dotriacontane, tritriacontane, tetratriacontane, pentatriacontane, hexatriacontane, oleylamine, and trioctylamine, more preferably octadecene, trioctylamines, oleylamine, squalane, pentacosane, hexacosane, octacosane, nonacosane, or triacontane, even more preferably octadecene, trioctylamines, oleylamine, squalane, pentacosane, or hexacosane, ketones, ether acetates such as PGMEA.

In a preferred embodiment of the present invention, each step of the steps (a) to (j) is carried out in an inert condition such as under $N_2$ or Argon (Ar) condition, preferably under Ar condition.

Semiconducting Nanoparticle

In another aspect of the present invention, the invention also relates to a semiconducting nanoparticle obtainable or obtained from the process of the present invention.

In a preferred embodiment the semiconducting nanoparticle is light emitting nanoparticle.

Composition

In another aspect, the present invention also relates to composition preferably comprising but not limited to, essentially consisting of, or consisting of, at least one nanoparticle of the present invention, preferably said nanoparticle is a light emitting nanoparticle of the present invention;

and at least one additional material, preferably the additional material is selected from the group consisting of organic light emitting materials, inorganic light emitting materials, charge transporting materials, scattering particles, host materials, nanosized plasmonic particles, photo initiators, and matrix materials.

Such suitable inorganic light emitting materials described above can be well known phosphors including nanosized phosphors, quantum sized materials like mentioned in the phosphor handbook, $2^{nd}$ edition (CRC Press, 2006), pp. 155-pp. 338 (W. M. Yen, S. Shionoya and H. Yamamoto), WO2011/147517A, WO2012/034625A, and WO2010/095140A.

According to the present invention, as said organic light emitting materials, charge transporting materials, any type of publicly known materials can be used preferably. For example, well known organic fluorescent materials, organic host materials, organic dyes, organic electron transporting materials, organic metal complexes, and organic hole transporting materials.

For examples of scattering particles, small particles of inorganic oxides such as $SiO_2$, $SnO_2$, CuO, CoO, $Al_2O_3$ $TiO_2$, $Fe_2O_3$, $Y_2O_3$, ZnO, MgO; organic particles such as polymerized polystyrene, polymerized PMMA; inorganic hollow oxides such as hollow silica or a combination of any of these; can be used preferably.

Matrix Material

According to the present invention, a wide variety of publicly known transparent matrix materials suitable for optical devices can be used preferably.

According to the present invention, the term "transparent" means at least around 60% of incident light transmits at the thickness used in an optical medium and at a wavelength or a range of wavelength used during operation of an optical medium. Preferably, it is over 70%, more preferably, over 75%, the most preferably, it is over 80%.

In a preferred embodiment of the present invention, as said matrix material, any type of publicly known transparent matrix material, described in for example, WO 2016/134820A can be used.

In some embodiments of the present invention, the transparent matrix material can be a transparent polymer.

According to the present invention the term "polymer" means a material having a repeating unit and having the weight average molecular weight (Mw) 1000 g/mol, or more.

The molecular weight $M_w$ is determined by means of GPC (=gel permeation chromatography) against an internal polystyrene standard.

In some embodiments of the present invention, the glass transition temperature (Tg) of the transparent polymer is 70° C. or more and 250° C. or less.

Tg is measured based on changes in the heat capacity observed in Differential scanning colorimetry like described in http://pslc.ws/macrog/dcs.htm; Rickey J Seyler, Assignment of the Glass Transition, ASTM publication code number (PCN) 04-012490-50.

For example, as the transparent polymer for the transparent matrix material, polyacrylates, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000 g/mol, more preferably it is from 10,000 to 250,000 g/mol.

In a preferable embodiment of the present invention, the composition comprises a plural of the light emitting nanoparticles and/or a plural of the semiconducting materials.

Formulation

In another aspect, the present invention relates to formulation comprising, essentially consisting of, or consisting of, at least one semiconducting nanoparticle, semiconducting light emitting nanoparticle or the composition of the present invention, and at least one solvent.

Preferably the solvent is selected from one or more members of the group consisting of aromatic, halogenated and aliphatic hydrocarbon solvents or alcohols or ethers or ketons or water, more preferably selected from one or more members of the group consisting of toluene, xylene, ethers, tetrahydrofuran, chloroform, dichloromethane and heptane, purified water, ester acetates, alcohols, sulfoxides, formamides, nitrides, ketones, ether acetates.

Preferably, the formulation contains a plurality of light emitting nanoparticles.

The amount of the solvent in the formulation can be freely controlled according to the method of coating the composition. For example, if the composition is to be spray-coated, it can contain the solvent in an amount of 90 wt. % or more. Further, if a slit-coating method, which is often adopted in coating a large substrate, is to be carried out, the content of the solvent is normally 60 wt. % or more, preferably 70 wt. % or more.

Use

In another aspect, the present invention relates to use of the semiconducting light emitting nanoparticle, or the semiconducting nanoparticle, or the composition, or the formulation, in an electronic device, optical device, sensing device or in a biomedical device.

Optical Medium

In another aspect, the present invention further relates to an optical medium comprising at least one semiconducting nanoparticle, preferably at least one semiconducting light emitting nanoparticle of the present invention, or the composition, or the formulation.

In some embodiments of the present invention, the optical medium can be an optical sheet, for example, a color filter, color conversion film, remote phosphor tape, or another film or filter.

According to the present invention, the term "sheet" includes film and/or layer like structured mediums.

In some embodiments of the present invention, the optical medium comprises an anode and a cathode, and at least one layer comprising at least one light emitting nanoparticle or the composition of the present invention, preferably said one organic layer is a light emission layer, more preferably the medium further comprises one or more additional layers selected from the group consisting of hole injection layers, hole transporting layers, electron blocking layers, hole blocking layers, electron blocking layers, and electron injection layers.

According to the present invention, any kinds of publicly available inorganic, and/or organic materials for hole injection layers, hole transporting layers, electron blocking layers, light emission layers, hole blocking layers, electron blocking layers, and electron injection layers can be used preferably, like as described in WO 2018/024719 A1, US2016/233444 A2, U.S. Pat. No. 7,754,841 B, WO 2004/037887 and WO 2010/097155.

In a preferable embodiment of the present invention, the optical medium comprises a plural of the semiconducting light emitting nanoparticles and/or a plural of the semiconducting nanoparticles.

In some embodiments the anode and the cathode of the optical medium sandwich the organic layer.

In some embodiments said additional layers are also sandwiched by the anode and the cathode.

In some embodiments of the present invention, the layer comprises at least one semiconducting nanoparticle, preferably it is a semiconducting light emitting nanoparticle, of the present invention, and a host material, preferably the host material is an organic host material.

Optical Device

In another aspect, the invention further relates to an optical device comprising the optical medium.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

Technical Effects

The present invention provides one or more of following effects; improvement of particle size distribution, better Full Width at Half Maximum (FWHM) value, improved self-absorption value, improvement of absorption per mg of nanoparticle(s), improvement of quantum yield of nanoparticle, well-controlled shell thickness, improved charge injection ability of nanoparticle, higher device efficiency, lowering trap emission of nanoparticle, optimizing a surface condition of shell part of nanoparticle, reducing lattice defects of a shell layer of nanoparticle, reducing/preventing formation of dangling bonds of shell layer, better thermal stability, better chemical stability, improved chemical stability in desired solvent(s), improved thermal stability in desired solvent(s), improved chemical stability in desired matrix(es), improved thermal stability in desired matrix(es), improved dispersion in matrixes, improved dispersion in solvents, improved hole injection ability into semiconducting light emitting nanoparticle, improved external quantum efficiency, optimizing fabrication process of nanoparticle, providing new fabrication process to improve size control of nanoparticle, providing new fabrication process for better kinetics control in shell formation, new shell formation process to realize well controlled shell thickness and/or reducing lattice defects of a shell layer, environmentally more friendly and safer fabrication process.

The core synthesis examples 1 to 2 and the working examples 1 to 10 below provide descriptions of the present invention, as well as an in-detail description of their fabrication.

WORKING EXAMPLES

Core Synthesis Example 1: Synthesis of Magic Sized Clusters (MSCs) Cluster Synthesis In a 500 mL 4-neck flask, weight 4.65 g (15.9 mmol) of indium acetate and 13.25 g (58.0 mmol) of myristic acid. The flask is equipped with a reflux condenser, septa and a tap between the flask and the condenser.

Put under vacuum at 100° C. for 8 h 15 min to off-gas acetic acid under reduced pressure, and overnight at room T.

Day after, the solution heat again to 100° C. and evacuate for 1 hour and 45 min in those conditions.

Total evacuation time at 100° C. for 10 hours,

At pressure: 85 mtorr.

Fill the reaction flask with argon and add 100 mL of dry toluene. Heat the reaction to 110° C.

Inject the mixture of 2.33 mL (2.0 g) of PTMS and 50 mL (43.5 g) of toluene into the flask with indium myristate (In(Ma)) at 110° C.

The formation of MSCs was monitored via UV—vis of timed aliquots taken from the reaction solution. There was a gradual improvement in the peak shape (red shift and sharpness).

When the improvement in the peak shape (red-shift and sharpness) is stopped the 2nd PTMS solution (1 ml (0.86 g) PTMS in 10.2 ml (8.77 g) Toluene) is added in portions of 2 mL to reach the optimal optical parameters. For example:

2 ml PTMS solution was added after 13 min 2 ml PTMS solution was added after 19 min 2 ml PTMS solution was added after 32 min After 44 min cool the reaction with fan and store the flask itself under inert atmosphere.

Results:

InP magic size clusters are formed with exciton at 387 nm.

The InP magic size clusters (MSCs) are cleaned with anhydrous acetonitrile (the ratio of crude:acetonitrile 18:13). The process is repeated with a mixture of anhydrous toluene and acetonitrile in ratio toluene:acetonitrile 1.5:1, 1.4:1, 1.75:1. This product is called "magic size clusters (MSCs)".

Core Synthesis Example 2: Core Synthesis

Synthesis of InP Nanoparticles Having an Exciton Wavelength of 593 nm

A 50 mL, 14/20, four-neck round-bottom flask equipped with a reflux condenser is evacuated, and 10 mL of distilled squalane is injected into it. The apparatus is evacuated with stirring (pressure is lowered from 300 mtorr to 200 mTorr during 1 hour) and heated to 375° C. under argon. In a glove box a solution of MSCs with a concentration of $3.15 \times 10^{-04}$ M is prepared in distilled squalane. 4 mL (1.26E–06 moles) of this solution is injected to the flask at 375° C., using a 16-gauge needle and 6 mL syringe;

after 4 minutes the mantle is removed, and the flask is cooled to 200° C. by blowing air with a fan. The mantle is then brought back, and the flask is heated to 265° C.

At this point more MSCs are added, using the same solution that is initially injected; 20-gauge needle and 3 m syringe are used, the addition is done at a rate of 0.7 ml/min at the given times (compared to the initial injection):

Minute 15—0.6 mL (1.89E–07 mol)

Minute 25—0.7 mL (2.21E–07 mol)

Minute 32—0.7 mL

Results:

InP QDs are formed with exciton at 593 nm.

Comparative Example 1: ZnSe Shell Synthesis on InP Cores, (Trioctyl Phosphine Selenide (TOP-Se) as Se Source)

In this example InP cores used are synthesized using the core synthesis described above (WO 2019/224134 A) and have core exciton CWL of 593 nm. The final core solution is cleaned with a mixture of anhydrous toluene and ethanol (ratio crude:toluene:ethanol: 1:2:8). The process is repeated with ratio crude:toluene:ethanol: 1:2:6. This solution will be called further "SSP InP cores".

Post-synthesis core treatment: In glove box (GB), SSP InP cores ($3.5 \times 10^{-7}$ mol) are dissolved with 0.2 ml toluene and transferred into 50 ml round bottom flask with 4.8 ml pumped oleylamine (OLAm) and 0.085 g ZnCl2. After short pumping at 50° C. to remove toluene, the flask is filled with argon and heated to 250° C. for 30 min. The solution is then cooled down to 180° C.

Shelling process: At 180° C., 2.6 mL of a 0.55M concentrated solution of $Zn(Cl)_2$ in OLAm and 1 amount (0.72 mL of 2M TOP-Se) of anion shell precursor are added to SSP InP cores after core treatment. After 30 min, the solution is heated to 200° C. After 30 min the solution is heated to 320° C., 3.2 mL of 0.4M Zn(Undecylenate)2 is injected and the reaction kept at 320° C. for 3 hrs. After 3 hrs at 320° C. the reaction is terminated by cooling down the reaction mixture.

The resulting nanoparticles are is cleaned with a mixture of anhydrous toluene and ethanol (ratio crude:toluene:ethanol: 3:4:8). The process is repeated. Then the nanoparticles are extracted with hexane.

Comparative Example 2: ZnSeS Shell Synthesis on InP Cores, (Trioctyl Phosphine Selenide (TOP-Se) as Se Source, Dodecanethiol (DDT) as S Source)

The comparative example is similar to comparative example 1, but 0.9 mmol of TOP-Se is injected at 180° C.; and 0.56 mmol of DDT is injected at 320° C., 10 min after injection of Zn(Undecylenate)2.

Working Example 1: ZnSe Outer Layer Synthesis on InP/ZnSe NPs in ODE, with 1-dodecaneselenol (DDSe) as Se Source Outer layer synthesis: At room temperature, $8.3 \times 10^{-8}$ mol of InP/ZnSe, described in comparative example 1, are dissolved with 0.2 ml toluene and transferred into 50 ml round bottom flask with 4 ml pumped 1-octadecene (ODE). After 30 min pumping at RT 1-dodecane selenol (0.2 mmol) is added and the flask is heated to 150° C. When temperature reached 150° C. Zn(Undecylenate)2 (0.2 mmol) is added and the reaction kept at 150° C. for 1.5 hrs. After 1.5 hours at 150° C. the reaction is terminated by cooling down the reaction mixture.

The resulting nanoparticles are is cleaned with a mixture of anhydrous toluene and ethanol (ratio crude:toluene:ethanol: 3:4:8). The process is repeated. Then the nanoparticles are extracted with hexane.

Table A compares the values of thermal, anti-radical, anti-peroxide stabilities for the described example and the comparative example 1.

Working Example 2: ZnS Outer Layer Synthesis on InP/ZnSe NPs in ODE, with 1-dodecanethiol as S Source The working example is similar to working example 1, but 1-dodecanethiol is used as sulphur precursor.

Working Example 3: ZnSeS Outer Layer Synthesis on InP/ZnSe NPs in ODE, with 1-dodecaneselenol as Se Source and 1-dodecanethiol as Sulphur The working example is similar to working examples 1 and 2, however 1-dodecaneselenol and 1-dodecanethiol are added together at equal molar amounts keeping the amount of Se+S ions same as before.

Working Example 4: ZnSeS Outer Layer Synthesis on InP/ZnSe NPs in ODE, with 1-dodecaneselenol as Se Source and 3-phenylethane Thiol as Sulphur Source The working example differs from the working example 3 by utilizing 3-phenylethane thiol instead of 1-dodecanethiol as sulphur source.

Working Example 5: ZnS Outer Layer Synthesis on InP/ZnSeS NPs in ODE, with 1-dodecanethiol as S Source The working example is similar to working example 2, but InP/ZnSeS particles are used. The InP/ZnSeS prepared as described in comp. ex. 2. Table A compares the values of thermal, anti-radical, anti-peroxide stabilities for the described example and the comparative example 2.

Working Example 6: ZnS Outer Layer Synthesis on InP/ZnSe NPs in ODE, with Perflurorodecane Thiol as S Source The working example is similar to working example 2, but perfluorodecane thiol is used as sulphur precursor.

TABLE A

| | QY, % | | | |
|---|---|---|---|---|
| Example | Clean NPs in toluene solution, Abs 0.5-0.7 | After thermal stability test | After Benzoquinone test | After peroxide test |
| Comparative example 1 | 51 | 29 | 13 | 26 |
| Comparative example 2 | 43 | 25 | | |
| Working example 1 | 53 | 50 | 40 | 51 |
| Working example 2 | 47 | 44 | Not measured | Not measured |
| Working example 5 | 47 | 42 | 47 | 40 |

Thermal stability test—powder thermal test at 150° C. in air

Benzoquinone test—2.667% wt of p-benzoquinone added to clean NPs in toluene

Peroxide test—50% wt of tertbutylperoxybenzoate added to clean NP in toluene

Working Example 7: Experimental Proof of Surface and Crystal Binding of DDSe of QDs from Working Example 1

Figure 4:
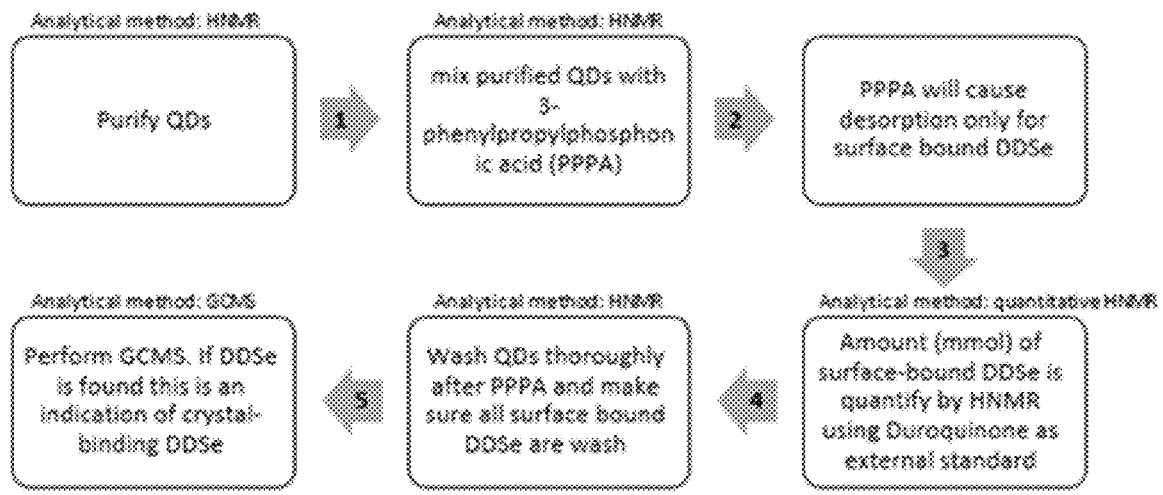
FIG. 4: describes the general scheme of a multi-step method that is established to differentiate between surface and crystal bound ligands, exemplified for dodecaneselenol (DDSe) (scheme1).

The general scheme mentioned in FIG. 4 (scheme1) describes a multi-step method that is established to characterize between surface and crystal bound ligands (covalently bound ligands), exemplified for dodecaneselenol (DDSe).

3-phenylpropylphosphonic acid (PPPA) is known for its stronger affinity to QDs surface compared to amines, thiols, selenols and carboxylic acids. Surface-bound ligands are desorbed from QDs surface and replaced by PPPA. On the other hand, crystal-bound ligands are integrated into the crystal lattice. Subsequently, their dissociation from QDs is impossible without destruction of the crystal.

Characterization of QDs from Working Example 1

FIG. 1: $^1$H NMR spectra (in toluene d8) of QDs from working example 1 before (a) and after (b) addition of PPPA Addition of PPPA leads to desorption of DDSe from QDs surface.

Amount (in mmol) of detached DDSe (surface-bound) is calculated by quantitative $^1$H NMR using Duroquinone as external standard and is equal to 0.00135 mmol. Meaning, Only 1.8% mol from total amount of DDSe that is inserted to reaction produced surface bound DDSe.

Figure 2:
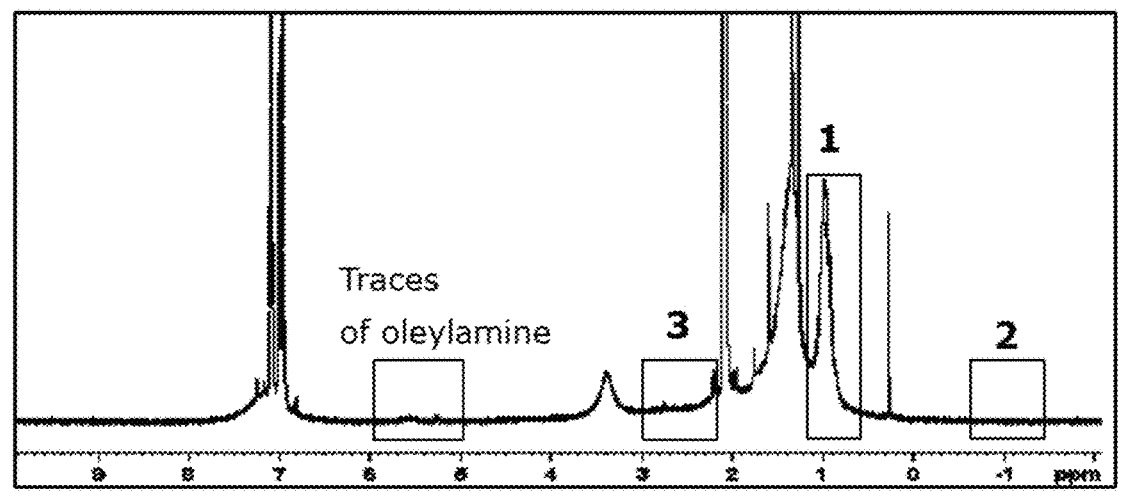
FIG. 2: $^1$H NMR spectrum (in toluene d8) of QDs from working example 1 after treating with PPPA and washing with ethanol

FIG. 2: $^1$H NMR spectrum (in toluene d8) of QDs after treating with PPPA and washing with ethanol $^1$H NMR indicates that surface-bound DDSe is completely removed from the surface of the QDs (signal #2 (Se—H) and signal #3 (CH2-Se) disappeared). however, Signal #1 ($CH_3$ of DDSe) still exist. this is an indication of presence of a second population of DDSe which is not surface bound.

QDs after removing all surface bound DDSe are analyzed in GCMS. For this purpose, proper derivatization with HCl and methanol is performed. This treatment leads to complete decomposition and dissolution of QDs.

Figure 3:
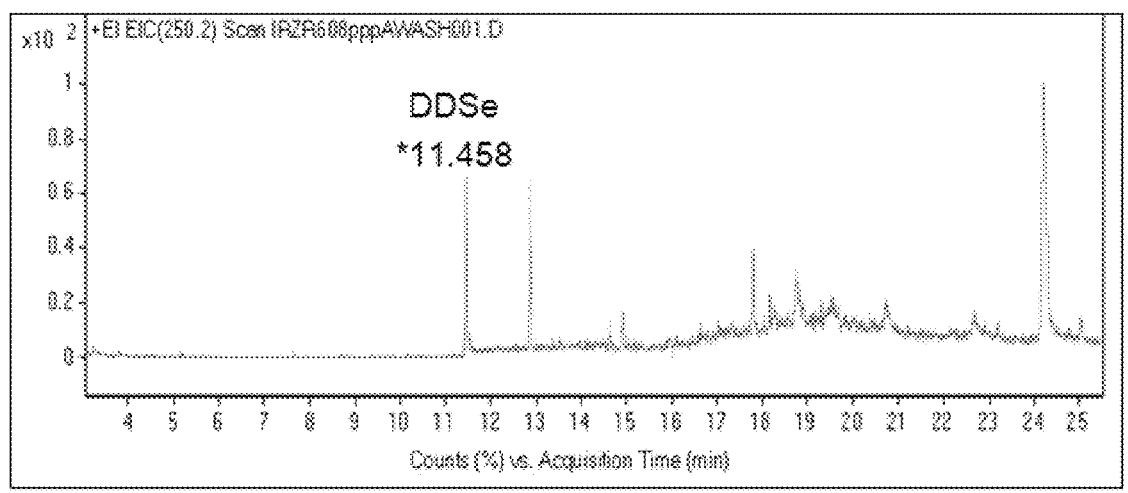
FIG. 3: GCMS spectrum for QDs from working example 1 after treating with PPPA and washing. MS spectrum of peak at retention time of 11.45.
Figure 3:
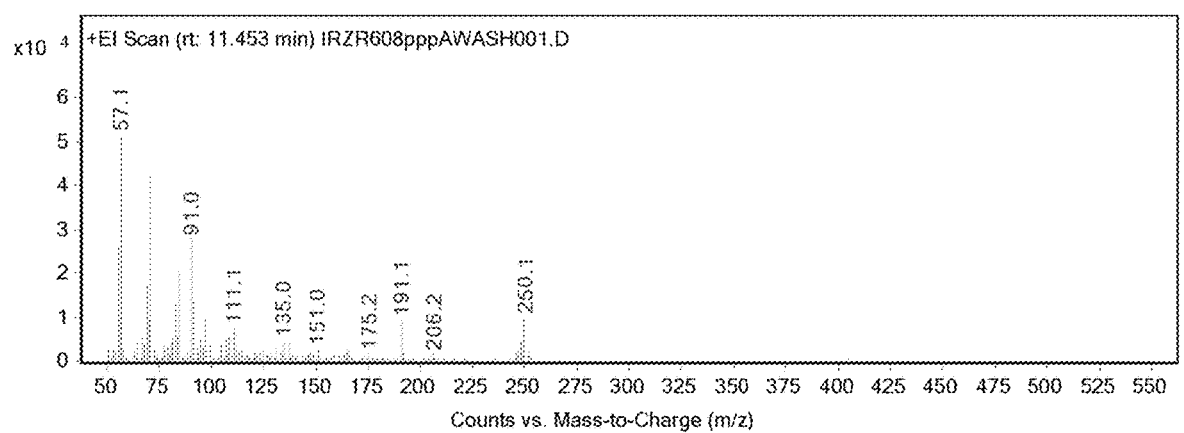

FIG. 3: GCMS spectrum for QDs after treating with PPPA and washing. MS spectrum of peak at retention time of 11.458.

The sample for GCMS was prepared as described in embodiments. GCMS confirms presence of DDSe. This indicates crystal binding of DDSe. Main conclusion: QDs from working example 1 contain surface—as well as crystal-bound DDSe.

Working Example 8: ZnS Outer Layer Synthesis on InP Based Red Quantum Dots in PGMEA, with Poly(Ethylene Glycol) Methyl Ether Thiol Mn 800 (mPEG800-SH) as S Source Weight 183.5 mg (1 mmol) of Zn(OAc)2 in the 50 mL-round bottom 4-neck reaction flask, put under vacuum for 40 minutes, put under argon, introduce to the glove box; add 6 mL of PGMEA and 0.61 mL of InP based red quantum materials (QMs).

Observation—red suspension.

Put under vacuum at room T, 20 min.

Put under Ar.

Add 2 mL of PGMEA.

Heated (in 8 min) to 144 C (reflux, cool the condenser with the water flow).

At 144 C inject 1.15 mL of the 0.43M mPEG-SH solution in PGMEA–t=0

Stay 65 min at 144° C.

inject 1.15 mL of the 0.43M mPEG-SH solution in PGMEA.

Stay 70 min at 144° C. End. In total—2 hrs 15 min at 144° C.

The resulting QDs are cleaned with anhydrous hexane (the ratio of crude:hexane 1:1). The process is repeated with a mixture of anhydrous PGMEA:hexane 1:1. Then the QDs are extracted with toluene.

TABLE B

| | QY, % | | |
|---|---|---|---|
| Example | Clean in toluene solution | In non-polar matrix, after 30 min at 180 C. under air | In polar matrix I, after 30 min at 180 C. under air |
| InP based red QDs w/o crystal bound mPEG800-SH | 67 | 40 | insoluble |
| Working example 8 | 68 | 62 | 62 |

Table B compares the values of thermal stability for the described Working example 8 and for the used first semiconducting material (InP based red quantum materials).

Working Example 9: ZnS Outer Layer Synthesis on InP Based Red Quantum Dots in PGMEA, with Poly(Ethylene Glycol) Methyl Ether Thiol Mn 800 (mPEG800-SH) as S Source 1.28 g of zinc acetate (Zn(OAc)2) are weighted into 250 ml round bottom flask and degassed for 25 min at 200 mTorr while stirring. Put under Ar atmosphere. Inserted into the glove box.

56 ml PGMEA and toluene solution of 2.1 gr of InP based red quantum materials is added. The mixture is mounted on a Schlenk line. Put under Ar.

Distillation set-up is mounted and toluene is distilled out.

The flask is heated to reflux and 7.7 ml of 0.4M mPEG800-SH solution in PGMEA is injected.

After 65 min another portion of 7.7 ml of 0.4M mPEG800-SH solution in PGMEA is injected.

The flask is cooled to RT after additional 70 min at reflux (total reaction time 2 h and 15 min).

The resulting QDs are cleaned as follows: solids are removed by centrifugation; QDs are precipitated with anhydrous hexane (the ratio of crude:hexane 1:1); the process is repeated with a mixture of anhydrous PGMEA:hexane 1:1, then twice with anhydrous toluene:hexane 2:3.

TABLE C

| | QY, % | |
|---|---|---|
| Example | Clean in toluene solution | In polar matrix II, after 30 min at 180 C. under argon |
| InP based red QDs with surface bound mPEG800-SH | 68 | 28 |
| Working example 9 | 68 | 46 |

Table C compares the values of thermal stability for the described Working example 9 with reference material, which is prepared similarly to Working example 9, but without Zn(OAc)2.

Working Example 10: ZnS Outer Layer Synthesis on InP Based Green Quantum Material Having Core-Shell Structure in Diisoptopylbenzene, with Poly(Ethylene Glycol) Methyl Ether Thiol Mn 350 (mPEG350-SH) as S Source 0.215 g of Zn(OAc)2 is weighted outside GB into 50 ml round bottom flask, the flask is introduced to GB. 8 ml of diisopropylbenzene (DIPB) and then toluene solution of 270 mg of InP based green quantum dots are added. The mixture is mounted on a Schlenk line and the toluene is removed under reduced pressure. The flask is filled with Ar. The flask is heated to 160° C. and 1.3 ml of 0.9M mPEG(350)-SH solution in diisopropylbenzene is injected. After 90 min at 160° C. the reaction cooled to ambient temperature. QDs precipitated upon cooling below 50 C. Toluene (6 mL) is added to dissolve the quantum dots.

The resulting QDs are cleaned as follows: solids are removed by centrifugation; QDs are precipitated with anhydrous heptane (the ratio of (crude+toluene):heptane 1:1), the process is repeated with a mixture of anhydrous PGMEA:heptane 1:2, then with anhydrous toluene:heptane 1:1.

The invention claimed is:

1. A semiconducting light-emitting nanoparticle comprising:
   a core;
   an outer layer covering at least a part of said core, comprising a metal cation and a divalent anion; and
   one or more types of organic moieties directly attached to the anion of the outer layer by covalent bond,
   wherein said divalent anion is selected from $Se^{2-}$, $S^{2-}$, $Te^{2-}$ $O^{2-}$ or a combination of any of these, and said metal cation is a monovalent, divalent, trivalent, or tetravalent cation, and
   wherein the organic moiety is represented by formula (III) or formula (IIIa)
   $*—(CH_2)_a—(OCH_2CH_2)_p—(V)_r—(CH_2)_q—Z$ (III)
   $*—(CH_2)_q—(V)_r—(OCH_2CH_2)_p—Z$ (IIIa)
   wherein
   V is O, $CH_2$ or C=O;
   Z is a hydrogen atom or an organic group;
   a is 0 or an integer 1 or more;
   p is an integer 1 or more;
   q is 0 or an integer 1 or more;
   r is 0 or an integer 1; and
   "*" represents the connecting point to the anion in the outer layer.

2. The nanoparticle of claim 1, wherein Z is a hydrogen atom, a straight alkyl group having 1 to 25 carbon atoms, a branched alkyl group having 3 to 25 carbon atoms, —COOH, —SH, or —$NH_2$, alkylamine, fluoroaryl, fluoroalkaryl, fluoroalkyl, or fluoroaralkyl;
   a is $0 \leq a \leq 25$;
   p is $1 \leq p \leq 20$; and
   q is $0 \leq q \leq 25$.

3. The nanoparticle of claim 1, wherein the organic moiety is represented by following chemical formula (IV):

$*—(CH_2)_a—(OCH_2CH_2)_p—(O)_r—(CH_2)_q—Z''$ (IV)

wherein a is 0 or an integer 1 or more;
   p is an integer 1 or more;
   q is 0 or an integer 1 or more;
   Z' is a hydrogen atom, a straight alkyl group having 1 to 25 carbon atoms, a branched alkyl group having 3 to 25 carbon atoms, an alkylamine, a fluoroaryl, a fluoroalkaryl, a fluoroalkyl, a fluoroaralkyl, or a heteroaromatic group;

r is 0 or an integer 1; and

"*" represents the connecting point to the anion in the outer layer.

4. The nanoparticle of claim 1, wherein the organic moiety is covalently bound to the anion in the outer layer of an inorganic lattice.

5. The nanoparticle of claim 3, wherein:
a is $0 \leq a \leq 25$;
p is $1 \leq p \leq 20$;
q is $0 \leq q \leq 25$; and
Z' is a is a straight alkyl group having 1 to 25 carbon atoms, a branched alkyl group having 3 to 25 carbon atoms or a hydrogen atom.

6. The nanoparticle of claim 1, wherein metal cation is a metal of group $12^+$.

7. The nanoparticle of claim 1, wherein p is $4 \leq p \leq 18$.

8. The nanoparticle of claim 1, wherein said metal cation is selected from $Zn^{2+}$, $Ni^{2+}$, $Co^{2+}$, $Ca^{2+}$, $Sr^{2+}$, $Hg^{2+}$, $Mg^{2+}$, $Pb^{2+}$, $Ti^{4+}$, $Ge^{4+}$, $Si^{4+}$, $Zr^{4+}$, $Hf^{4+}$, $Sn^{4+}$, and combinations thereof.

9. The nanoparticle of claim 8, wherein the metal cation is $Zn^{2+}$, $Hg^{2+}$, or $Pb^{2+}$, and combinations thereof.

10. A process for fabricating semiconducting nanoparticle, said process comprising:
(a) mixing at least a semiconducting nanoparticle with a solvent to get a reaction mixture;
(b) forming an outer layer onto the semiconducting nanoparticle in the reaction mixture by reacting at least an anion source represented by formula (III'), formula (IIIa"), or formula (IV') with a metal cation precursor in a reaction mixture;

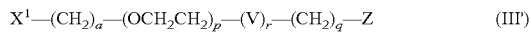

$$X^1\text{—}(CH_2)_a\text{—}(OCH_2CH_2)_p\text{—}(V)_r\text{—}(CH_2)_q\text{—}Z \quad (III')$$

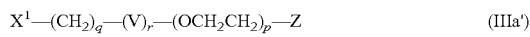

$$X^1\text{—}(CH_2)_q\text{—}(V)_r\text{—}(OCH_2CH_2)_p\text{—}Z \quad (IIIa')$$

wherein
$X^1$ is an anchor group comprising at least a divalent anion capable of attaching to said metal cation, selected from one or more member of the group consisting of $Se^{2-}$, $S^{2-}$, $Te^{2-}$, and $O^{2-}$;
V is O, $CH_2$ or C=O;
Z is a hydrogen atom or an organic group;
a is 0 or an integer 1 or more;
p is an integer 1 or more;
q is 0 or an integer 1 or more;
r is 0 or an integer 1;

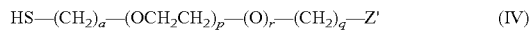

$$HS\text{—}(CH_2)_a\text{—}(OCH_2CH_2)_p\text{—}(O)_r\text{—}(CH_2)_q\text{—}Z' \quad (IV)$$

wherein a is 0 or an integer 1 or more;
p is an integer 1 or more;
q is O or an integer 1 or more;
Z' is a hydrogen atom a straight alkyl group having 1 to 25 carbon atoms, a branched alkyl group having 3 to 25 carbon atoms, an alkylamine, a fluoroaryl, a fluoroalkaryl, a fluoroalkyl, or a fluoroaralkyl; and r is 0 or an integer 1; and
(c) cooling the reaction mixture from (b),
wherein the reaction mixture in (b) is kept at a temperature in the range from 80° C. to 200° C. to form the outer layer in (b).

11. The process of claim 10, wherein an injection of said anion source is carried out at the temperature in the range from 0° C. to 200° C. in (a) or in (b).

12. The process according to claim 10, wherein (b) is performed in a time period in the range from 1 minute to 10 hours.

13. The process according to claim 10, wherein the ratio of the total molar amount of the cation precursor to the total molar amount of the semiconducting nanoparticle in (b) is in the range from 20:1 to 200000:1.

14. The process according to claim 10, wherein the molar ratio of the total amount of the anion source and the total amount of the cation precursor used in (b) is in the range from 20:1 to 1:20.

15. A semiconducting nanoparticle prepared by the process according to claim 10.

16. A composition comprising at least one semiconducting nanoparticle according to claim 1,
and at least one additional material selected from organic light emitting materials, inorganic light emitting materials, charge transporting materials, scattering particles, host materials, nanosized plasmonic particles, photo initiators, and matrix materials.

17. A formulation comprising:
at least one semiconducting nanoparticle according to claim 1, and
at least one solvent selected from one or more members of the group consisting of aromatic, halogenated and aliphatic hydrocarbon solvents, ethers, esters, ionic liquids, alcohols and water.

18. The formulation according to claim 17, wherein said at least one solvent is selected from one or more members of the group consisting of toluene, xylene, tetrahydrofuran, chloroform, dichloromethane, heptane, hexane, purified water, ester acetates, ether acetates, etheric esters, alcohols, sulfoxides, formamides, nitrides, and ketones.

19. An electronic device, optical device, sensing device or biomedical device containing semiconducting nanoparticle according to claim 1.

20. An optical medium comprising at least one semiconducting nanoparticle according to claim 1.

21. The optical medium of claim 20, comprising an anode, a cathode, and at least one layer comprising said at least one semiconducting nanoparticle.

22. The optical medium of claim 21, wherein the layer comprises said at least one semiconducting nanoparticle and a host material.

23. An optical device comprising at least said optical medium according to claim 20.

* * * * *